United States Patent
Kasai et al.

(10) Patent No.: US 11,971,566 B2
(45) Date of Patent: Apr. 30, 2024

(54) HORIZONTALLY ORIENTED LIQUID CRYSTAL CURED FILM AND LAMINATE INCLUDING THE SAME

(71) Applicant: Sumitomo Chemical Company, Limited, Tokyo (JP)

(72) Inventors: Tatsuaki Kasai, Nishio (JP); Nobuyuki Hatanaka, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 641 days.

(21) Appl. No.: 17/263,267

(22) PCT Filed: Jul. 17, 2019

(86) PCT No.: PCT/JP2019/028045
§ 371 (c)(1),
(2) Date: Apr. 9, 2021

(87) PCT Pub. No.: WO2020/026805
PCT Pub. Date: Feb. 6, 2020

(65) Prior Publication Data
US 2023/0018608 A1    Jan. 19, 2023

(30) Foreign Application Priority Data
Jul. 31, 2018    (JP) .................................. 2018-144255

(51) Int. Cl.
*G02B 5/30* (2006.01)
*C09K 19/38* (2006.01)
*H10K 59/50* (2023.01)

(52) U.S. Cl.
CPC ........ *G02B 5/3016* (2013.01); *C09K 19/3861* (2013.01); *H10K 59/50* (2023.02)

(58) Field of Classification Search
CPC ........... G02F 1/13363; G02F 1/133634; G02F 1/133637; G02F 1/133638
USPC ............................................ 349/96, 117–121
See application file for complete search history.

(56) References Cited

U.S. PATENT DOCUMENTS

| | | | |
|---|---|---|---|
| 2010/0045901 A1* | 2/2010 | Uehira | C07D 277/64 349/193 |
| 2015/0042941 A1 | 2/2015 | Hatanaka et al. | |
| 2015/0042942 A1 | 2/2015 | Hatanaka et al. | |
| 2015/0042943 A1 | 2/2015 | Hatanaka et al. | |
| 2015/0042944 A1 | 2/2015 | Hatanaka et al. | |
| 2015/0043071 A1 | 2/2015 | Hatanaka et al. | |
| 2015/0049291 A1 | 2/2015 | Hatanaka et al. | |
| 2015/0079380 A1* | 3/2015 | Muramatsu | C09K 19/2028 252/299.61 |
| 2017/0023717 A1* | 1/2017 | Hatanaka | G02B 5/3016 |
| 2019/0302334 A1* | 10/2019 | Atsumi | C09K 19/3852 |
| 2020/0012147 A1 | 1/2020 | Osato et al. | |

FOREIGN PATENT DOCUMENTS

| | | |
|---|---|---|
| JP | 2005208415 A | 8/2005 |
| JP | 2008273925 A | 11/2008 |
| JP | 2015163935 A | 9/2015 |
| JP | 2015200861 A | 11/2015 |
| WO | 2018030244 A1 | 2/2018 |

* cited by examiner

*Primary Examiner* — Edward J Glick
*Assistant Examiner* — David Y Chung
(74) *Attorney, Agent, or Firm* — Panitch Schwarze Belsiario & Nadel LLP

(57) ABSTRACT

A laminate including a horizontally oriented liquid crystal cured film that is a cured material of a polymerizable liquid crystal composition containing at least one type of polymerizable liquid crystal compound, and a vertically oriented liquid crystal cured film is provided. The horizontally oriented liquid crystal cured film is the cured material of the polymerizable liquid crystal composition in which the polymerizable liquid crystal compound is cured in a state of being horizontally oriented with respect to a plane of the liquid crystal cured film, and satisfies the following formulae: $nxA(450) > nyA(450) > nzA(450)$ and $ReA(450)/ReA(550) < 1.00$.

20 Claims, No Drawings

HORIZONTALLY ORIENTED LIQUID CRYSTAL CURED FILM AND LAMINATE INCLUDING THE SAME

CROSS-REFERENCE TO RELATED APPLICATIONS

This application is a Section 371 of International Application No. PCT/JP2019/028045, filed Jul. 17, 2019, which was published in the Japanese language on Feb. 6, 2020, under International Publication No. WO 2020/026805 A1, which claims priority under 35 U.S.C. § 119(b) to Japanese Application No. 2018-144255, filed Jul. 31, 2018, the disclosures of each of which are incorporated herein by reference in their entireties.

TECHNICAL FIELD

The present invention relates to a laminate including a horizontally oriented liquid crystal cured film. The present invention also relates to a horizontally oriented liquid crystal cured film and a method of producing the same.

BACKGROUND ART

An elliptical polarizing plate is an optical member in which a polarizing plate and a phase difference plate are laminated. For example, in a device such as an organic EL image display device that displays an image in a planar state, the elliptical polarizing plate is used to prevent light reflection from electrodes constituting the device. As the phase difference plate constituting this elliptical polarizing plate, a so-called λ/4 plate is generally used.

As the phase difference plate constituting the elliptical polarizing plate, a phase difference plate exhibiting reverse wavelength dispersibility is preferred in that uniform phase difference performance can be easily exhibited in a wide wavelength range of visible light. As such a phase difference plate, there is known a phase difference plate made of a horizontally oriented liquid crystal cured film in which a polymerizable liquid crystal compound exhibiting reverse wavelength dispersibility is polymerized and cured in a state of being horizontally oriented with respect to a plane of the phase difference plate. The phase difference plate made of the horizontally oriented liquid crystal cured film suppresses coloring of reflected light when viewed from a front direction. In addition, in recent years, there has been a demand for an elliptical polarizing plate having an optical compensation function so as exhibit, even when viewed from an oblique direction, the same optical performance as when viewed from the front direction. There has been proposed a phase difference plate including a horizontally oriented liquid crystal cured film having reverse wavelength dispersibility and a vertically oriented liquid crystal cured film in which a polymerizable liquid crystal compound is polymerized and cured in a state of being oriented perpendicular to a plane of the phase difference plate (Patent Document 1).

PRIOR ART DOCUMENT

Patent Document

Patent Document 1: JP-A-2015-163935

SUMMARY OF THE INVENTION

Problems to be Solved by the Invention

However, in the elliptical polarizing plate with the optical compensation function obtained by combining the conventional horizontally oriented liquid crystal cured film exhibiting reverse wavelength dispersibility and a vertically oriented liquid crystal cured film, due to the fact that wavelength dispersion characteristics of each cured film do not match to each other, the effect of improving an oblique reflection hue is not as high as the effect of improving a front reflection hue, which has not been sufficiently satisfactory.

Thus, an object of the present invention is to provide a horizontally oriented liquid crystal cured film capable of improving both a reflection hue in a front direction and an oblique reflection hue when combined with a vertically oriented liquid crystal cured film, and a laminate including the horizontally oriented liquid crystal cured film.

Means for Solving the Problems

As a result of diligent studies to solve the above problems, the present inventors have completed the present invention. That is, the present invention includes the following aspects.

[1] A laminate including a horizontally oriented liquid crystal cured film that is a cured material of a polymerizable liquid crystal composition containing at least one type of polymerizable liquid crystal compound, and a vertically oriented liquid crystal cured film, in which the horizontally oriented liquid crystal cured film is the cured material of the polymerizable liquid crystal composition in which the polymerizable liquid crystal compound is cured in a state of being horizontally oriented with respect to a plane of the liquid crystal cured film, and satisfies a formula (1):

$$nxA(450) > nyA(450) > nzA(450) \tag{1}$$

[in the formula (1), $nxA(450)$ represents a main refractive index at a wavelength λ of 450 nm in a film surface of the horizontally oriented liquid crystal cured film, $nyA(450)$ represents a refractive index at a wavelength λ of 450 nm in a direction orthogonal to a direction of $nxA$ in the same plane as $nxA$, and $nzA(450)$ represents a refractive index at a wavelength λ of 450 nm in a film thickness direction of the horizontally oriented liquid crystal cured film], and a formula (2):

$$ReA(450)/ReA(550) < 1.00 \tag{2}$$

[in the formula (2), $ReA(\lambda)$ represents an in-plane phase difference value of the horizontally oriented liquid crystal cured film at a wavelength of λ nm, and $ReA(\lambda) = (nxA(\lambda) - nyA(\lambda)) \times dA$ (dA represents a film thickness of the horizontally oriented liquid crystal cured film)].

[2] The laminate according to the above [1], in which the horizontally oriented liquid crystal cured film satisfies a formula (3):

$$nxA(550) > nyA(550) > nzA(550) \tag{3}$$

[in the formula (3), $nxA(550)$ represents a main refractive index at a wavelength λ of 550 nm in the film surface of the horizontally oriented liquid crystal cured film, $nyA(550)$ represents a refractive index at a wavelength λ of 550 nm in the direction orthogonal to the direction of $nxA$ in the same plane as $nxA$, and $nzA(550)$ represents a refractive index at a wavelength λ of 550 nm in the film thickness direction of the horizontally oriented liquid crystal cured film].

[3] The laminate according to the above [1] or [2], in which the horizontally oriented liquid crystal cured film satisfies a formula (4):

$$\frac{\frac{nxA(450) + nyA(450)}{2} - nzA(450)}{\frac{nxA(550) + nyA(550)}{2} - nzA(550)} - \frac{nxA(450) - nyA(450)}{nxA(550) - nyA(550)} > 0 \qquad (4)$$

[4] The laminate according to any one of the above [1] to [3], in which the horizontally oriented liquid crystal cured film satisfies a formula (5):

$$0.02 \leq nxA(550) - nyA(550) \leq 0.10 \qquad (5)$$

[5] The laminate according to any one of the above [1] to [4], in which at least one type of polymerizable liquid crystal compound forming the horizontally oriented liquid crystal cured film is a polymerizable liquid crystal compound having a maximum absorption wavelength between wavelengths of 300 and 400 nm.

[6] The laminate according to any one of the above [1] to [5], in which the horizontally oriented liquid crystal cured film satisfies a formula (6):

$$120 \text{ nm} \leq ReA(550) \leq 170 \text{ nm} \qquad (6)$$

[7] The laminate according to any one of the above [1] to [6], satisfying a formula (7):

$$\frac{nxA(450) - nyA(450)}{nxA(550) - nyA(550)} < \frac{\frac{nxA(450) + nyA(450)}{2} - nzA(450)}{\frac{nxA(550) + nyA(550)}{2} - nzA(550)} \leq \frac{\frac{nxC(450) + nyC(450)}{2} - nzC(450)}{\frac{nxC(550) + nyC(550)}{2} - nzC(550)} \qquad (7)$$

[in the formula (7), nxC(λ) represents a main refractive index at a wavelength of λ nm in a film surface of the vertically oriented liquid crystal cured film, nyC(λ) represents a refractive index at a wavelength of λ nm in a direction orthogonal to a direction of nxC in the same plane as nxC, nzC(λ) represents a refractive index at a wavelength of λ nm in a film thickness direction of the vertically oriented liquid crystal cured film, and nxA(λ), nyA(λ), and nzA(λ) are as above defined].

[8] An elliptical polarizing plate including the laminate according to any one of [1] to [7] and a polarizing film.

[9] The elliptical polarizing plate according to the above [8], in which an angle between a slow axis of a horizontally oriented liquid crystal cured film in the laminate and an absorption axis of the polarizing film is 45±5°.

[10] An organic EL display device including the elliptical polarizing plate according to [8] or [9].

[11] A horizontally oriented liquid crystal cured film that is a cured material of a polymerizable liquid crystal composition containing at least one type of polymerizable liquid crystal compound, and the cured material of the polymerizable liquid crystal composition in which the polymerizable liquid crystal compound is cured in a state of being horizontally oriented with respect to a plane of a liquid crystal cured film, the horizontally oriented liquid crystal cured film satisfying a formula (1):

$$nxA(450) > nyA(450) > nzA(450) \qquad (1)$$

[in the formula (1), nxA(450) represents a main refractive index at a wavelength λ of 450 nm in a film surface of the horizontally oriented liquid crystal cured film, nyA(450) represents a refractive index at a wavelength λ of 450 nm in a direction orthogonal to a direction of nxA in the same plane as nxA, and nzA(450) represents a refractive index at a wavelength λ of 450 nm in a film thickness direction of the horizontally oriented liquid crystal cured film], and a formula (2):

$$ReA(450)/ReA(550) < 1.00 \qquad (2)$$

[in the formula (2), ReA(λ) represents an in-plane phase difference value of the horizontally oriented liquid crystal cured film at a wavelength of λ nm, and ReA(λ)=(nxA(λ)−nyA(λ))×dA (dA represents a film thickness of the horizontally oriented liquid crystal cured film)].

[12] The horizontally oriented liquid crystal cured film according to the above [11], satisfying a formula (3):

$$nxA(550) > nyA(550) > nzA(550) \qquad (3)$$

[13] The horizontally oriented liquid crystal cured film according to the above [11] or [12], satisfying a formula (4):

$$\frac{\frac{nxA(450) + nyA(450)}{2} - nzA(450)}{\frac{nxA(550) + nyA(550)}{2} - nzA(550)} - \frac{nxA(450) - nyA(450)}{nxA(550) - nyA(550)} > 0 \qquad (4)$$

[14] The horizontally oriented liquid crystal cured film according to any one of the above [11] to [13], satisfying a formula (5):

$$0.02 \leq nxA(550) - nyA(550) \leq 0.10 \qquad (5)$$

[15] The horizontally oriented liquid crystal cured film according to any one of the above [11] to [14], in which at least one type of polymerizable liquid crystal compound is a polymerizable liquid crystal compound having a maximum absorption wavelength between wavelengths of 300 and 400 nm.

[16] The horizontally oriented liquid crystal cured film according to any one of the above [11] to [15], satisfying a formula (6):

$$120 \text{ nm} \leq ReA(550) \leq 170 \text{ nm} \qquad (6)$$

[17] A method of producing the horizontally oriented liquid crystal cured film according to any one of the above [11] to [16], the method including
forming a coating film of a polymerizable liquid crystal composition containing at least one type of polymerizable liquid crystal compound and orienting the polymerizable liquid crystal compound horizontally with respect to a plane of the coating film,
inducing orientation melting of the horizontally oriented polymerizable liquid crystal compound, and
after the induction of the orientation melting, curing the polymerizable liquid crystal composition while maintaining a horizontal orientation state of the polymerizable liquid crystal compound.

[18] The production method according to the above [17], in which at least one type of polymerizable liquid crystal compound is a polymerizable liquid crystal compound having a maximum absorption wavelength between wavelengths of 300 and 400 nm.

[19] The production method according to the above [17] or [18], in which the step of inducing the orientation melting is performed by heating the polymerizable liquid crystal compound at a temperature lower than a nematic liquid crystal phase transition temperature of the polymerizable liquid crystal compound and a room temperature or higher.

[20] The production method according to any one of the above [17] to [19], in which the step of inducing the orientation melting is performed by drying the coating film of the polymerizable liquid crystal composition in a solvent atmosphere.

Effect of the Invention

The present invention can provide a horizontally oriented liquid crystal cured film capable of improving both a reflection hue in a front direction and an oblique reflection hue when combined with a vertically oriented liquid crystal cured film, and a laminate including the horizontally oriented liquid crystal cured film.

MODE FOR CARRYING OUT THE INVENTION

The laminate of the present invention includes a horizontally oriented liquid crystal cured film that is a cured material of a polymerizable liquid crystal composition containing at least one type of polymerizable liquid crystal compound, and a vertically oriented liquid crystal cured film. The horizontally oriented liquid crystal cured film constituting the laminate of the present invention is the cured material of the polymerizable liquid crystal composition in which at least one type of polymerizable liquid crystal compound contained in the polymerizable liquid crystal composition is cured in a state of being horizontally oriented with respect to a plane of a liquid crystal cured film to be obtained, and the horizontally oriented liquid crystal cured film satisfies the following formulas (1) and (2):

$$nxA(450) > nyA(450) > nzA(450) \quad (1)$$

$$ReA(450)/ReA(550) < 1.00 \quad (2)$$

In the formula (1), nxA(450) represents a main refractive index at a wavelength λ of 450 nm in a film surface of the horizontally oriented liquid crystal cured film, nyA(450) represents a refractive index at a wavelength λ of 450 nm in a direction orthogonal to a direction of nxA in the same plane as nxA, and nzA(450) represents a refractive index at a wavelength λ of 450 nm in a film thickness direction of the horizontally oriented liquid crystal cured film. In the formula (2), ReA(λ) represents an in-plane phase difference value of the horizontally oriented liquid crystal cured film at a wavelength of λ nm, and ReA(λ)=(nxA(λ)−nyA(λ))×dA (dA represents a film thickness of the horizontally oriented liquid crystal cured film).

In the present invention, the horizontally oriented liquid crystal cured film is formed of a polymerizable liquid crystal compound exhibiting so-called reverse wavelength dispersibility in which the in-plane phase difference value at a short wavelength is larger than the in-plane phase difference value at a long wavelength.

The polymerizable liquid crystal compound exhibiting such a reverse wavelength dispersibility usually has a T-shaped structure in which constituent molecules are arranged in a major axis direction serving as a main chain of the compound and a direction intersecting the major axis direction. Conventionally, in a horizontally oriented liquid crystal cured film exhibiting reverse wavelength dispersibility, in a polymerizable liquid crystal compound, refractive indices nxA, nyA and nzA in three directions in a refractive index ellipsoid formed by the orientation have a relationship of nxA>nyA≈nzA (positive A plate). In the positive A plate, the directionality (orientation) of the constituent molecules arranged in the direction intersecting the major axis direction of the polymerizable liquid crystal compound having a T-shaped structure is not controlled, and nyA that is the refractive index in a direction orthogonal to a direction of nxA in a plane of the liquid crystal cured film has the same magnitude as the refractive index nzA in a direction perpendicular to the plane of the liquid crystal cured film (nyA≈nzA).

On the other hand, the present invention controls the directionality (orientation) of the constituent molecules arranged in the direction intersecting the major axis direction of the polymerizable liquid crystal compound having a T-shaped structure, and makes the refractive index nyA in the direction orthogonal to the direction of nxA in the plane of the liquid crystal cured film larger than the refractive index nzA in the direction perpendicular to the plane of the liquid crystal cured film. That is, in the present invention, the horizontally oriented liquid crystal cured film satisfies the formula (1):

$$nxA(450) > nyA(450) > nzA(450) \quad (1)$$

As a result, the horizontally oriented liquid crystal cured film of the present invention has lower wavelength dispersibility (that is, a value of αA described later decreases), and therefore, when an elliptical polarizing plate including the horizontally oriented liquid crystal cured film is applied to a display device, a good front reflection hue can be obtained. At the same time, as the refractive index nzA in the direction perpendicular to the plane of the liquid crystal cured film becomes smaller, the wavelength dispersibility in the film thickness direction (vertical direction) of the horizontally oriented liquid crystal cured film tends to increase (that is, a value of αthA described later increases). Conventionally, a vertically oriented liquid crystal cured film exhibiting positive wavelength dispersibility (high wavelength dispersibility) has been widely used in an elliptical polarizing plate with an optical compensation function, so that a reflection hue change in an oblique direction (for example, a problem that coloring such as red or blue is confirmed in an oblique reflection hue of a display) can be controlled by applying, to the display device, an elliptical polarizing plate including the horizontally oriented liquid crystal cured film and the vertically oriented liquid crystal cured film having high wavelength dispersibility. In addition, the polymerizable liquid crystal compound generally used for forming the horizontally oriented liquid crystal cured film exhibiting reverse wavelength dispersibility has a limited structure, and it may be difficult to design or produce the polymerizable liquid crystal compound. However, according to the present invention, a relationship of a three-dimensional refractive index of the horizontally oriented liquid crystal cured film obtained can be controlled even when the same polymerizable liquid crystal compound is used.

In the present invention, the horizontally oriented liquid crystal cured film satisfies the above formula (2) showing reverse wavelength dispersibility. Since the reverse wavelength dispersibility is improved, and the effect of improving the reflection hue in a front direction of the horizontally oriented liquid crystal cured film can be further improved, ReA(450)/ReA(550) is preferably 0.70 or more and more preferably 0.78 or more, and preferably 0.95 or less and more preferably 0.92 or less.

The in-plane phase difference value can be adjusted by the thickness dA of the horizontally oriented liquid crystal cured film. Since the in-plane phase difference value is determined by the above formula: $ReA(\lambda)=(nxA(\lambda)-nyA(\lambda))\times dA$, the three-dimensional refractive index and the film thickness dA may be adjusted in order to obtain a desired in-plane phase difference value (ReA($\lambda$): the in-plane phase difference value of the horizontally oriented liquid crystal cured film at a wavelength $\lambda$ (nm)). The three-dimensional refractive index depends on the molecular structure and orientation state of the polymerizable liquid crystal compound described later.

The horizontally oriented liquid crystal cured film constituting the laminate of the present invention preferably further satisfies the following formula (3).

$$nxA(550) > nyA(550) > nzA(550) \tag{3}$$

In the formula (3), nxA(550) represents a main refractive index at a wavelength $\lambda$ of 550 nm in the film surface of the horizontally oriented liquid crystal cured film, nyA(550) represents a refractive index at a wavelength $\lambda$ of 550 nm in the direction orthogonal to the direction of nxA in the same plane as nxA, and nzA(550) represents a refractive index at a wavelength $\lambda$ of 550 nm in the film thickness direction of the horizontally oriented liquid crystal cured film.

When the horizontally oriented liquid crystal cured film satisfies the above formula (3) together with the above formula (1), the effect of improving the front reflection hue is remarkable when the elliptical polarizing plate including the horizontally oriented liquid crystal cured film is applied to the display device, and the effect of highly suppressing a tint change in the oblique reflection hue can be obtained when a combination of the horizontally oriented liquid crystal cured film and the vertically oriented liquid crystal cured film is applied to the display device. Hereinafter, the effect relating to "improvement of the front reflection hue" in the present specification means an improvement effect in the front reflection hue when the elliptical polarizing plate including the horizontally oriented liquid crystal cured film is applied to the display device, and the effect relating to "improvement of the oblique reflection hue" means an improvement effect in the oblique reflection hue when the elliptical polarizing plate including a combination of the horizontally oriented liquid crystal cured film and the vertically oriented liquid crystal cured film is applied to the display device.

In the present invention, the horizontally oriented liquid crystal cured film preferably satisfies the following formula (4).

$$\frac{\frac{nxA(450)+nyA(450)}{2}-nzA(450)}{\frac{nxA(550)+nyA(550)}{2}-nzA(550)} - \frac{nxA(450)-nyA(450)}{nxA(550)-nyA(550)} > 0 \tag{4}$$

The formula (4) means that a ratio (hereinafter, also referred to as "$\alpha thA$") of the phase difference values at a wavelength of 450 nm and a wavelength of 550 nm in the film thickness direction of the horizontally oriented liquid crystal cured film is larger than a ratio (hereinafter, also referred to as "$\alpha A$") of the phase difference values at a wavelength of 450 nm and a wavelength of 550 nm in the film surface of the horizontally oriented liquid crystal cured film. Although $\alpha thA \approx \alpha A$ in the conventional positive A plate, $\alpha thA - \alpha A > 0$, that is, $\alpha thA > \alpha A$, so that the reverse wavelength dispersibility of the horizontally oriented liquid crystal cured film becomes higher ($\alpha A$ becomes smaller). When the elliptical polarizing plate including the horizontally oriented liquid crystal cured film is applied to the display device, the front reflection hue can be improved, and in combination with the vertically oriented liquid crystal cured film, the effect of highly suppressing the tint change in the oblique reflection hue can be obtained.

The horizontally oriented liquid crystal cured film preferably satisfies the following formula (5).

$$0.02 \leq nxA(550) - nyA(550) \leq 0.10 \tag{5}$$

When a value of a difference nxA−nyA of the in-plane refractive indices is within the above range, a thin laminate having excellent optical characteristics can be obtained.

In addition, the horizontally oriented liquid crystal cured film preferably satisfies the following formula (6).

$$120 \text{ nm} \leq ReA(550) \leq 170 \text{ nm} \tag{6}$$

When the in-plane phase difference ReA(550) of the horizontally oriented liquid crystal cured film is within the range of the formula (6), the effect of improving the front reflection hue (the effect of suppressing coloring) when the elliptical polarizing plate including the horizontally oriented liquid crystal cured film is applied to the display device becomes remarkable. A more preferred range of the in-plane phase difference value is 130 nm$\leq$ReA(550)$\leq$150 nm.

The horizontally oriented liquid crystal cured film is a cured material of a polymerizable liquid crystal composition containing at least one type of polymerizable liquid crystal compound. The polymerizable liquid crystal compound contained in the polymerizable liquid crystal composition of the present invention means a liquid crystal compound having a polymerizable group, particularly a photopolymerizable group. The polymerizable liquid crystal compound is not particularly limited as long as it can form a liquid crystal cured film satisfying the above formulas (1) and (2). For example, a polymerizable liquid crystal compound conventionally known in the field of phase difference film can be used.

A polymerizable group refers to a group that can be involved in a polymerization reaction. The photopolymerizable group is a polymerizable group and refers to a group that can be involved in a polymerization reaction by a reactive species generated from a photopolymerization initiator, for example, by an active radical, acid, etc. Examples of the photopolymerizable group include a vinyl group, vinyloxy group, 1-chlorovinyl group, isopropenyl group, 4-vinylphenyl group, acryloyloxy group, methacryloyloxy group, oxylanyl group, and oxetanyl group. Among them, an acryloyloxy group, methacryloyloxy group, vinyloxy group, oxylanyl group, and oxetanyl group are preferred, and an acryloyloxy group is more preferred. The liquid crystallinity exhibited by the polymerizable liquid crystal compound may be a thermotropic liquid crystal or a lyotropic liquid crystal, but the thermotropic liquid crystal is preferred because a film thickness can be precisely controlled. The phase order structure in the thermotropic liquid crystallinity may be nematic liquid crystal or smectic liquid crystal. The polymerizable liquid crystal compound can be used alone or in combination of two or more.

The polymerizable liquid crystal compound is preferably a compound having the following characteristics (1) to (4).

(1) A compound capable of forming a nematic phase or a smectic phase.

(2) Having $\pi$ electrons on the major axis direction (a) of the polymerizable liquid crystal compound.

(3) Having $\pi$ electrons on the direction [intersecting direction (b)] intersecting with the major axis direction (a).

(4) A polymerizable liquid crystal compound in which: a π-electron density, in the major axis direction (a), of the compound that is defined by the following formula (i):

$$D(\pi a) = N(\pi a)/N(Aa) \quad \text{(i)}$$

[where, N(πa) is the total number of π electrons existing in the major axis direction (a) and N(Aa) is the total of molecular weight existing in the major axis direction] and a π-electron density, in the intersecting axis direction (b), of the compound that is defined by the following formula (ii):

$$D(\pi b) = N(\pi b)/N(Ab) \quad \text{(ii)}$$

[where, N(πb) is the total number of n electrons existing in the intersecting direction (b) and N(Ab) is the total molecular weight existing in the intersecting direction (b)]

are in the relation of the following formula (iii);

$$0 \le [D(\pi a)/D(\pi b)] < 1 \quad \text{(iii)}$$

[That is, the π-electron density in the intersecting direction (b) is larger than the π-electron density in the major axis direction (a)]. As described above, the polymerizable liquid crystal compound having n electrons on the major axis and on the direction intersecting with the major axis has, for example, a T-shaped structure.

The polymerizable liquid crystal compound is preferably a compound capable of forming a nematic phase.

In the above characteristics (1) to (4), the major axis direction (a) and the number of n electrons N are defined as follows.

When the polymerizable liquid crystal compound is, for example, a compound having a rod-like structure, the major axis direction (a) is the rod-shaped major axis direction.

The number of n electrons N (πa) existing on the major axis direction (a) does not include a n electron that disappear due to the polymerization reaction.

The number of n electrons N (πa) existing on the major axis direction (a) includes the number of n electrons that is the total number of n electrons on the major axis and n electrons conjugating therewith, is, for example, a ring existing on the major axis direction (a), and exists in a ring satisfying Hückel's law.

The number of n electrons N (πb) existing on the intersecting direction (b) does not include n electrons that disappear due to the polymerization reaction.

The polymerizable liquid crystal compound satisfying the above has a mesogen structure in the major axis direction. A liquid crystal phase (nematic phase, smectic phase) is expressed by this mesogen structure.

When applied onto an orientation film and heated to a temperature higher than or equal to its phase transition temperature, the polymerizable liquid crystal compound satisfying the above (1) to (4) can form a nematic phase and a smectic phase. In the nematic phase or smectic phase formed by orienting the polymerizable liquid crystal compound, the polymerizable liquid crystal compound is usually oriented such that the major axis directions are parallel to each other, and this major axis direction becomes the orientation direction of the nematic phase. When such a polymerizable liquid crystal compound is formed into a film and polymerized in a state of the nematic phase or the smectic phase, a polymer film formed from a polymer polymerized in a state oriented in the major axis direction (a) can be formed. This polymer film absorbs ultraviolet rays by the π electrons in the major axis direction (a) and the π electrons in the intersecting direction (b). Here, an absorption maximum wavelength of ultraviolet rays absorbed by the π electrons on the intersecting direction (b) is defined as λbmax. λbmax is usually 300 nm to 400 nm. Since a density of the n electron satisfies the above formula (iii) and the density of the n electron in the intersecting direction (b) is larger than the density of the n electron in the major axis direction (a), a polymer film in which absorption of linearly polarized ultraviolet rays (wavelength is λbmax) having an oscillating surface in the intersecting direction (b) is larger than absorption of linearly polarized ultraviolet rays (wavelength is λbmax) having an oscillating surface in the major axis direction (a) is obtained. The ratio (the ratio of the absorbance in the intersecting direction (b) of the linearly polarized ultraviolet rays/the absorbance in the major axis direction (a)) is, for example, more than 1.0, preferably 1.2 or more, usually 30 or less, and for example, 10 or less.

Most of the polymerizable liquid crystal compounds having the above characteristics generally exhibit reverse wavelength dispersibility. Specific examples include a compound represented by the following formula (λ):

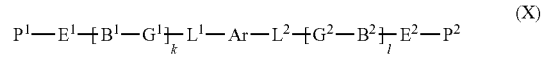

(X)

In the formula (λ), Ar represents a divalent group having an aromatic group that may have a substituent. The aromatic group referred to here refers to a group in which the number of π-electrons held by the cyclic structure is [4n+2] according to Hückel's rule, and may have two or more Ar groups, as exemplified by (Ar-1) to (Ar-23) described later, for example, via a divalent linking group. Where, n represents an integer. In the case where a ring structure is formed by containing a hetero atom such as —N═ or —S—, a case is also included, where the Hückel's rule is satisfied including the non-covalent bond electron pairs on these hetero atoms and aromaticity is held. It is preferred that the aromatic group contains at least one of a nitrogen atom, oxygen atom, and sulfur atom. The divalent group Ar may include one aromatic group or two or more aromatic groups.

When there is one aromatic group, the divalent group Ar may be a divalent aromatic group that may have a substituent. When two or more aromatic groups are included in the divalent group Ar, the two or more aromatic groups may be bonded to each other by a single bond or a divalent linking group such as —CO—O— or —O—.

$G^1$ and $G^2$ each independently represent a divalent aromatic group or a divalent alicyclic hydrocarbon group. Here, the hydrogen atom contained in the divalent aromatic group or the divalent alicyclic hydrocarbon group may be substituted with a halogen atom, alkyl group having 1 to 4 carbon atoms, fluoroalkyl group having 1 to 4 carbon atoms, alkoxy group having 1 to 4 carbon atoms, cyano group, or nitro group. The carbon atom forming the divalent aromatic group or the divalent alicyclic hydrocarbon group may be substituted with an oxygen atom, sulfur atom, or nitrogen atom.

$L^1$, $L^2$, $B^1$, and $B^2$ are each independently a single bond or divalent linking group.

k and l each independently represent an integer from 0 to 3, and satisfy the relationship of $1 \le k+l$. Here, when $2 \le k+l$, each of $B^1$ and $B^2$ and $G^1$ and $G^2$ may be the same as or different from each other.

$E^1$ and $E^2$ each independently represent an alkanediyl group having 1 to 17 carbon atoms, and here, $E^1$ and $E^2$ are more preferably an alkanediyl group having 4 to 12 carbon atoms. A hydrogen atom contained in the alkanediyl group may be substituted with a halogen atom, and —CH$_2$— contained in the alkanediyl group may be substituted with —O—, —S—, —SiH$_2$—, or —C(=O)—.

P$^1$ and P$^2$ each independently represent a polymerizable group or a hydrogen atom, and at least one of them is a polymerizable group.

G$^1$ and G$^2$ are each independently preferably a 1,4-phenylenediyl group which may be substituted with at least one substituent selected from the group consisting of a halogen atom and an alkyl group having 1 to 4 carbon atoms or a 1,4-cyclohexanediyl group which may be substituted with at least one substituent selected from the group consisting of a halogen atom and an alkyl group having 1 to 4 carbon atoms, more preferably 1,4-phenylenediyl group substituted with a methyl group, an unsubstituted 1,4-phenylenediyl group or an unsubstituted 1,4-trans-cyclohexanediyl group, particularly preferably an unsubstituted 1,4-phenylenediyl group or an unsubstituted 1,4-trans-cyclohexanediyl group.

Additionally, at least one of a plurality of G$^1$ and G$^2$ that are present is preferably a divalent alicyclic hydrocarbon group, and at least one of G$^1$ and G$^2$ bound to L$^1$ or L$^2$ is more preferably a divalent alicyclic hydrocarbon group.

L$^1$ and L$^2$ are, each independently, preferably a single bond, alkylene group having 1 to 4 carbon atoms, —O—, —S—, —R$^{a1}$OR$^{a2}$—, —R$^{a3}$COOR$^{a4}$—, —R$^{a5}$OCOR$^{a6}$—, —R$^{a7}$OC=OOR$^{a8}$—, —N=N—, —CR$^c$=CR$^d$—, or —C≡—. Here, R$^{a1}$ to R$^{a8}$ each independently represent a single bond or alkylene group having 1 to 4 carbon atoms, and R$^c$ and R$^d$ represent an alkyl group having 1 to 4 carbon atoms or a hydrogen atom. L$^1$ and L$^2$ are, each independently, more preferably a single bond, —OR$^{a2-1}$—, —CH$_2$—, —CH$_2$CH$_2$—, —COOR$^{a4-1}$—, or OCOR$^{a6-1}$—. Here, R$^{2a-1}$, R$^{a4-1}$, and R$^{a6-1}$ each independently represent one of a single bond, —CH$_2$—, and —CH$_2$CH$_2$—. L$^1$ and L$^2$ are, each independently, more preferably a single bond, —O—, —CH$_2$CH$_2$—, —COO—, —COOCH$_2$CH$_2$—, or OCO—.

B$^1$ and B$^2$ are, each independently, preferably a single bond, alkylene group having 1 to 4 carbon atoms, —O—, —S—, —R$^{a9}$OR$^{a10}$—, —R$^{a11}$COOR$^{a12}$—, —R$^{a13}$OCOR$^{a14}$—, or R$^{a15}$OC=OOR$^{a16}$—. Here, R$^{a9}$ to R$^{a16}$ each independently represent a single bond or alkylene group having 1 to 4 carbon atoms. B$^1$ and B$^2$ are, each independently, more preferably a single bond, —OR$^{a10-1}$—, —CH$_2$—, —CH$_2$CH$_2$—, —COOR$^{a12-1}$—, or OCOR$^{a14-1}$—. Here, R$^{a10-1}$, R$^{a12-1}$, and R$^{a14-1}$ each independently represent any one of a single bond, —CH$_2$—, and —CH$_2$CH$_2$—. B$^1$ and B$^2$ are, each independently, more preferably a single bond, —O—, —CH$_2$CH$_2$—, —COO—, —COOCH$_2$CH$_2$—, —OCO—, or OCOCH$_2$CH$_2$—.

k and l are preferably within the range of 2 k+l≤6, preferably k+l=4 holds, and more preferably k=2 and l=2, from the viewpoint of exhibiting reverse wavelength dispersibility. When k=2 and l=2, a symmetrical structure is preferably formed.

Examples of the polymerizable group represented by P$^1$ or P$^2$ include an epoxy group, a vinyl group, a vinyloxy group, a 1-chlorovinyl group, an isopropenyl group, a 4-vinylphenyl group, an acryloyloxy group, a methacryloyloxy group, an oxiranyl group, and an oxetanyl group.

Among them, an acryloyloxy group, methacryloyloxy group, vinyloxy group, oxylanyl group, and oxetanyl group are preferred, and an acryloyloxy group is more preferred.

It is preferred that Ar has at least one selected from an aromatic hydrocarbon ring that may have a substituent, an aromatic heterocycle that may have a substituent, and an electron-withdrawing group. Examples of the aromatic hydrocarbon ring include a benzene ring, naphthalene ring, anthracene ring, and the like, and a benzene ring and naphthalene ring are preferred. Examples of the aromatic heterocycle include a furan ring, benzofuran ring, pyrrole ring, indole ring, thiophene ring, benzothiophene ring, pyridine ring, pyrazine ring, pyrimidine ring, triazole ring, triazine ring, pyrroline ring, imidazole ring, pyrazole ring, thiazole ring, benzothiazole ring, thienothiazole ring, oxazole ring, benzoxazole ring, phenanthroline ring, and the like. Among them, it is preferred to have a thiazole ring, benzothiazole ring, or benzofuran ring, and it is more preferred to have a benzothiazole group. When Ar contains a nitrogen atom, it is preferred that the nitrogen atom has π electrons.

In the formula (λ), the total number N$_\pi$ of π electrons contained in the divalent aromatic group represented by Ar is preferably 8 or more, more preferably 10 or more, further preferably 14 or more, and particularly preferably 16 or more. On the other hand, it is preferably 30 or less, more preferably 26 or less, and further preferably 24 or less.

Examples of the aromatic group represented by Ar include, for example, the following groups.

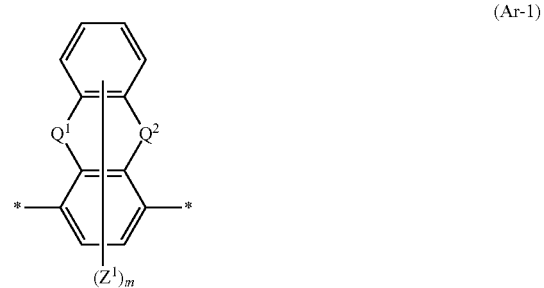

(Ar-1)

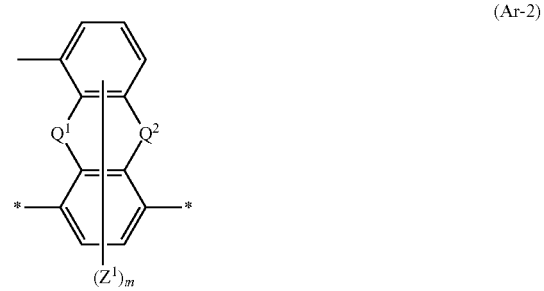

(Ar-2)

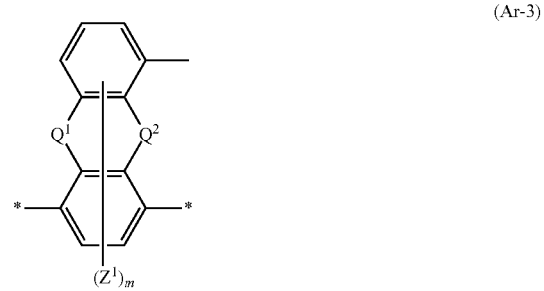

(Ar-3)

-continued
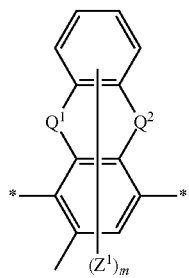
(Ar-4)
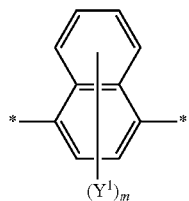
(Ar-5)
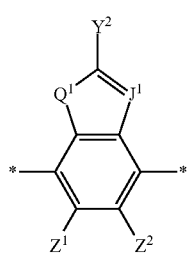
(Ar-6)
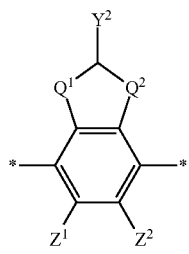
(Ar-7)
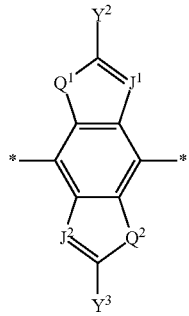
(Ar-8)
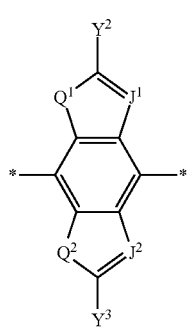
(Ar-9)
-continued
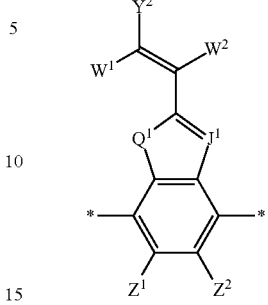
(Ar-10)
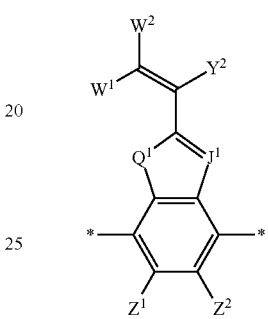
(Ar-11)
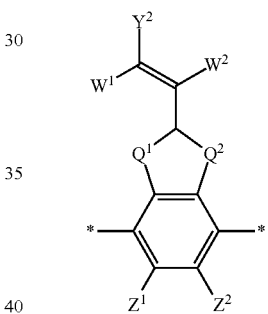
(Ar-12)
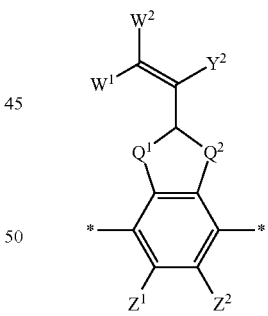
(Ar-13)
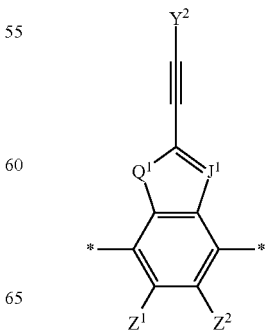
(Ar-14)

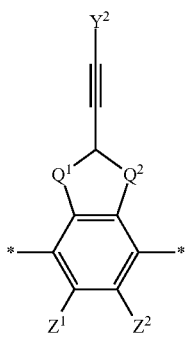
(Ar-15)

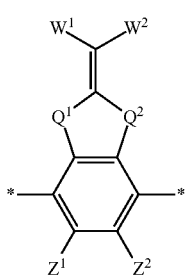
(Ar-16)

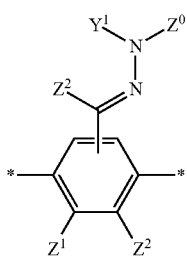
(Ar-17)

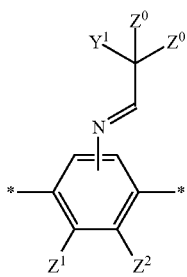
(Ar-18)

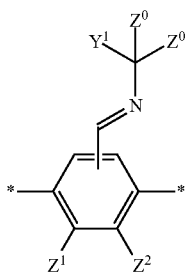
(Ar-19)

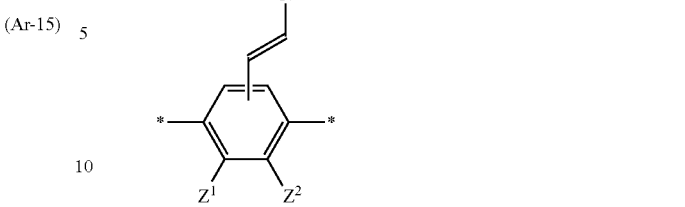
(Ar-20)

(Ar-21)

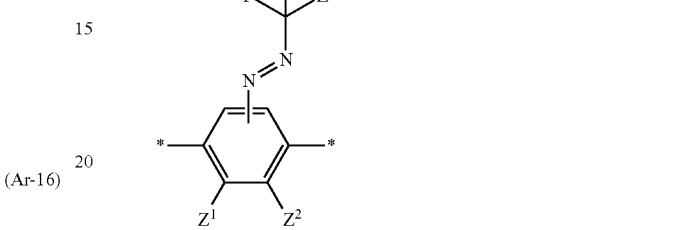
(Ar-22)

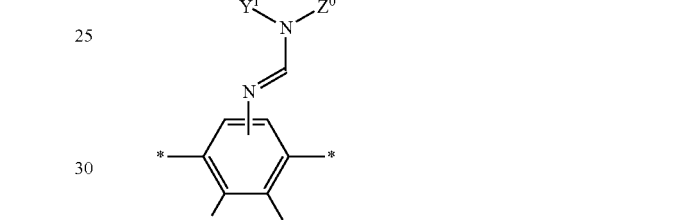
(Ar-23)

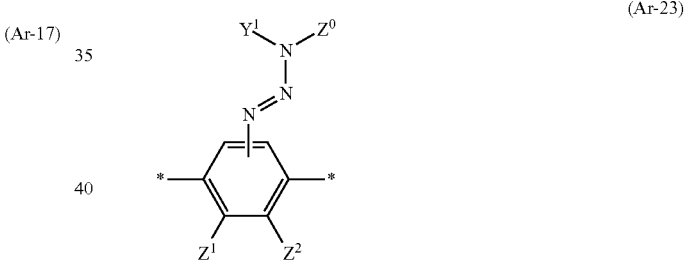

In the formulas (Ar-1) to (Ar-23), * mark represents a connecting part; and $Z^0$, $Z^1$, and $Z^2$ each independently represent a hydrogen atom, halogen atom, alkyl group having 1 to 12 carbon atoms, cyano group, nitro group, alkylsulfinyl group having 1 to 12 carbon atoms, alkylsulfonyl group having 1 to 12 carbon atoms, carboxyl group, fluoroalkyl group having 1 to 12 carbon atoms, alkoxy group having 1 to 12 carbon atoms, alkylthio group having 1 to 12 carbon atoms, N-alkylamino group having 1 to 12 carbon atoms, N,N-dialkylamino group having 2 to 12 carbon atoms, N-alkylsulfamoyl group having 1 to 12 carbon atoms, or N,N-dialkylsulfamoyl group having 2 to 12 carbon atoms. $Z^0$, $Z^1$ and $Z^2$ may contain a polymerizable group.

$Q^1$ and $Q^2$ each independently represent —$CR^{2'}R^{3'}$—, —S—, —NH—, —$NR^{2'}$—, —CO— or —O—, and $R^{2'}$ and $R^{3'}$ each independently represent a hydrogen atom or an alkyl group having 1 to 4 carbon atoms.

$J^1$ and $J^2$ each independently represent a carbon atom or a nitrogen atom.

$Y^1$, $Y^2$ and $Y^3$ each independently represent an optionally substituted aromatic hydrocarbon group or aromatic heterocyclic group.

$W^1$ and $W^2$ each independently represent a hydrogen atom, a cyano group, a methyl group or a halogen atom, and m represents an integer of 0 to 6.

Examples of the aromatic hydrocarbon groups in $Y^1$, $Y^2$, and $Y^3$ include aromatic hydrocarbon groups having 6 to 20 carbon atoms, such as a phenyl group, naphthyl group, anthryl group, phenanthryl group, and biphenyl group. A phenyl group and naphthyl group are preferred, and a phenyl group is more preferred. Examples of the aromatic heterocyclic groups include aromatic heterocyclic groups that contain at least one hetero atom such as a nitrogen atom, oxygen atom, or sulfur atom and have 4 to 20 carbon atoms, such as a furyl group, pyrrolyl group, thienyl group, pyridinyl group, thiazolyl group, and benzothiazolyl group. A furyl group, thienyl group, pyridinyl group, thiazolyl group, and benzothiazolyl group are preferred.

$Y^1$, $Y^2$ and $Y^3$ may each independently represent an optionally substituted polycyclic aromatic hydrocarbon group or polycyclic aromatic heterocyclic group. The polycyclic aromatic hydrocarbon group refers to a condensed polycyclic aromatic hydrocarbon group or a group derived from an aromatic ring assembly. The polycyclic aromatic heterocyclic group refers to a condensed polycyclic aromatic heterocyclic group or a group derived from an aromatic ring assembly.

$Z^0$, $Z^1$ and $Z^2$ are, each independently, preferably a hydrogen atom, halogen atom, alkyl group having 1 to 12 carbon atoms, cyano group, nitro group, and alkoxy group having 1 to 12 carbon atoms. $Z^0$ is more preferably a hydrogen atom, alkyl group having 1 to 12 carbon atoms, and cyano group. $Z^1$ and $Z^2$ are more preferably a hydrogen atom, fluorine atom, chlorine atom, methyl group, and cyano group. $Z^0$, $Z^1$ and $Z^2$ may contain a polymerizable group.

$Q^1$ and $Q^2$ are preferably —NH—, —S—, —NR$^{2'}$—, and —O—, and R$^{2'}$ is preferably a hydrogen atom. Among them, —S—, —O—, and —NH— are particularly preferred.

Among the formulas (Ar-1) to (Ar-23), the formula (Ar-6) and the formula (Ar-7) are preferred from the viewpoint of molecular stability.

In the formulas (Ar-16) to (Ar-23), $Y^1$, together with the nitrogen atom to which it is bound and $Z^0$, may form an aromatic heterocyclic group. Examples of the aromatic heterocyclic group include those described above as the aromatic heterocyclic ring that Ar may have, and examples thereof include, for example, a pyrrole ring, imidazole ring, pyrroline ring, pyridine ring, pyrazine ring, pyrimidine ring, indole ring, quinoline ring, isoquinoline ring, purine ring, and pyrrolidine ring. This aromatic heterocyclic group may have a substituent. Alternatively, $Y^1$, together with the nitrogen atom to which it is bound and $Z^0$, may be the above polycyclic aromatic hydrocarbon group or polycyclic aromatic heterocyclic group that may be substituted. Examples include a benzofuran ring, a benzothiazole ring, and a benzoxazole ring.

At least one type of polymerizable liquid crystal compound forming the horizontally oriented liquid crystal cured film is preferably a polymerizable liquid crystal compound having a maximum absorption wavelength between wavelengths of 300 and 400 nm. When the polymerizable liquid crystal composition contains a photopolymerization initiator, the polymerization reaction and gelation of the polymerizable liquid crystal compound may progress during long-term storage. However, if the maximum absorption wavelength of the polymerizable liquid crystal compound is 300 to 400 nm, even if ultraviolet light is exposed during storage, it is possible to effectively suppress generation of reactive species from the photopolymerization initiator, the polymerization reaction of the polymerizable liquid crystal compound by the reactive species, and progression of gelation. Therefore, it is advantageous in terms of long-term stability of the polymerizable liquid crystal composition, and the orientation and film thickness uniformity of a liquid crystal cured film to be obtained can be improved. The maximum absorption wavelength of the polymerizable liquid crystal compound can be measured in a solvent using an ultraviolet-visible spectrophotometer. The solvent is a solvent capable of dissolving a polymerizable liquid crystal compound, and examples thereof include chloroform.

The content of the polymerizable liquid crystal compound in the polymerizable liquid crystal composition is, for example, 70 to 99.5 parts by mass, preferably 80 to 99 parts by mass, more preferably 85 to 98 parts by mass, and further preferably 90 to 95 parts by mass based on 100 parts by mass of the solid content of the polymerizable liquid crystal composition. When the content of the polymerizable liquid crystal compound is within the above range, it is advantageous from the viewpoint of the orientation of the liquid crystal cured film to be obtained. In the present specification, the solid content of the polymerizable liquid crystal composition means all the components of the polymerizable liquid crystal composition excluding volatile components such as organic solvents.

The polymerizable liquid crystal composition used for forming the horizontally oriented liquid crystal cured film may further contain additives such as a solvent, a photopolymerization initiator, a leveling agent, an antioxidant, and a photosensitizer in addition to the polymerizable liquid crystal compound. These components may be used alone or in combination of two or more.

Since the polymerizable liquid crystal composition for forming a horizontally oriented liquid crystal cured film is usually applied to a base material or the like in a state of being dissolved in a solvent, it is preferred to contain a solvent. The solvent is preferably a solvent which can dissolve the polymerizable liquid crystal compound and is preferably a solvent which is inactive on the polymerization reaction of the polymerizable liquid crystal compound. Examples of the solvent include water, alcohol solvents such as methanol, ethanol, ethylene glycol, isopropyl alcohol, propylene glycol, ethylene glycol methyl ether, ethylene glycol butyl ether, 1-methoxy-2-propanol, 2-butoxy ethanol, and propylene glycol monomethyl ether; ester solvents such as ethyl acetate, butyl acetate, ethylene glycol methyl ether acetate, γ-butyrolactone, propylene glycol methyl ether acetate, and ethyl lactate; ketone solvents such as acetone, methyl ethyl ketone, cyclopentanone, cyclohexanone, 2-heptanone, and methyl isobutyl ketone; aliphatic hydrocarbon solvents such as pentane, hexane, and heptane; alicyclic hydrocarbon solvents such as ethylcyclohexane; aromatic hydrocarbon solvents such as toluene and xylene; nitrile solvents such as acetonitrile; ether solvents such as tetrahydrofuran and dimethoxyethane; chlorine-containing solvents such as chloroform and chlorobenzene; and amide type solvents such as dimethylacetamide, dimethylformamide or N-methyl-2-pyrrolidone (NMP), and 1,3-dimethyl-2-imidazolidinone.

These solvents can be used alone or in combination of two or more. Among these, alcohol solvents, ester solvents, ketone solvents, chlorine-containing solvents, amide type solvents, and aromatic hydrocarbon solvents are preferred.

The content of the solvent in the polymerizable liquid crystal composition is preferably 50 to 98 parts by mass, and more preferably 70 to 95 parts by mass, based on 100 parts by mass of the polymerizable liquid crystal composition.

Therefore, the solid content with respect to 100 parts by mass of the polymerizable liquid crystal composition is preferably 2 to 50 parts by mass. When the solid content is 50 parts by mass or less, a viscosity of the polymerizable liquid crystal composition is low, so that the thickness of the film becomes substantially uniform, and unevenness tends to be less likely to occur. The solid content can be appropriately determined in consideration of the thickness of the liquid crystal cured film to be produced.

The polymerization initiator is a compound capable of generating a reactive species due to contribution of heat or light and initiating a polymerization reaction of a polymerizable liquid crystal compound or the like. Examples of the reactive species include active species such as radicals, cations or anions. Among these, from the viewpoint of ease of reaction control, a photopolymerization initiator that generates radicals by light irradiation is preferred.

Examples of the photopolymerization initiator include benzoin compounds, benzophenone compounds, benzyl ketal compounds, α-hydroxyketone compounds, α-aminoketone compounds, triazine compounds, iodonium salts, and sulfonium salts. Specific examples thereof include IRGACURE (registered trademark) 907, IRGACURE 184, IRGACURE 651, IRGACURE 819, IRGACURE 250, IRGACURE 369, IRGACURE 379, IRGACURE 127, IRGACURE 2959, IRGACURE 754, IRGACURE 379EG (all manufactured by BASF Japan Ltd.); SEIKUOL BZ, SEIKUOL Z, and SEIKUOL BEE (all manufactured by Seiko Chemical Co., Ltd.); KAYACURE BP100 (manufactured by Nippon Kayaku Co., Ltd.); KAYACURE UVI-6992 (manufactured by the Dow Chemical Company); ADEKA OPTOMER SP-152, ADEKA OPTOMER SP-170, ADEKA OPTOMER N-1717, ADEKA OPTOMER N-1919, ADEKA ARKLS NCI-831, and ADEKA ARKLS NCI-930 (all manufactured by Adeka Corporation); and TAZ-A and TAZ-PP (all manufactured by Nihon Siber Hegner K.K.), and TAZ-104 (manufactured by Sanwa Chemical Co., Ltd.).

In the polymerizable liquid crystal composition for forming a horizontally oriented liquid crystal cured film, at least one type of the photopolymerization initiator is contained, and one type or two types of the photopolymerization initiators is preferably contained.

Since the photopolymerization initiator can fully utilize energy emitted from a light source and is excellent in productivity, a maximum absorption wavelength is preferably 300 nm to 400 nm, more preferably 300 nm to 380 nm, and particularly, α-acetophenone-based polymerization initiator and an oxime-based photopolymerization initiator are preferred.

Examples of α-acetophenone compounds include 2-methyl-2-morpholino-1-(4-methylsulfanylphenyl)propane-1-one, 2-dimethylamino-1-(4-morpholinophenyl)-2-benzylbutane-1-one and 2-dimethylamino-1-(4-morpholinophenyl)-2-(4-methylphenylmethyl)butan-1-one. More preferred examples include 2-methyl-2-morpholino-1-(4-methylsulfanylphenyl)propan-1-one and 2-dimethylamino-1-(4-morpholinophenyl)-2-benzylbutan-1-one. Examples of commercially available products of α-acetophenone compounds include IRGACURE 369, 379EG, 907 (all manufactured by BASF Japan Ltd.), and SEIKUOL BEE (manufactured by Seiko Chemical Co., Ltd.).

The oxime ester-based photopolymerization initiator generates a radical such as a phenyl radical and a methyl radical by light irradiation. The polymerization of the polymerizable liquid crystal compound progresses suitably by this radical, and in particular, the oxime ester-based photopolymerization initiator that generates a methyl radical is preferred in that polymerization reaction initiation efficiency is high. From the viewpoint of more efficiently progressing the polymerization reaction, it is preferred to use a photopolymerization initiator that can efficiently use ultraviolet rays having a wavelength of 350 nm or more. As the photopolymerization initiator that can efficiently use an ultraviolet ray having a wavelength of 350 nm or more, a triazine compound or a carbazole compound including an oxime ester structure is preferred, and the carbazole compound including an oxime ester structure is more preferred from the viewpoint of sensitivity. Example of the carbazole compound having an oxime ester structure include 1,2-octanedione, 1-[4-(phenylthio)-2-(O-benzoyloxime)], ethanone, and 1[9-ethyl-6-(2-methylbenzoyl)-9H-carbazole-3-yl]-1-(O-acetyloxime). Examples of commercially available products of the oxime ester-based photopolymerization initiator include IRGACURE OXE-01, IRGACURE OXE-02, and IRGACURE OXE-03 (all manufactured by BASF Japan Ltd.), and ADEKA OPTOMER N-1919 and ADEKA ARKLS NCI-831 (all manufactured by Adeka Corporation).

The content of the photopolymerization initiator is usually 0.1 to 30 parts by mass, preferably 1 to 20 parts by mass, more preferably 1 to 15 parts by mass based on 100 parts by mass of the polymerizable liquid crystal compound. If the amount is in the above range, reaction of a polymeric group will fully progress, and orientation of a polymerizable liquid crystal compound is hardly disturbed.

The leveling agent is an additive having a function of adjusting fluidity of a polymerizable liquid crystal composition so as to further level a coating film to be obtained by application of the composition, and examples include silicone-based, polyacrylate-based and perfluoroalkyl-based leveling agents. A commercially available product may be used as the leveling agent, and specific examples include DC3PA, SH7PA, DC11PA, SH28PA, SH29PA, SH30PA, ST80PA, ST86PA, SH8400, SH8700 and FZ2123 (all manufactured by Dow Corning Toray Co., Ltd.); KP321, KP323, KP324, KP326, KP340, KP341, X22-161A and KF6001 (all manufactured by Shin-Etsu Chemical Co., Ltd.); TSF400, TSF401, TSF410, TSF4300, TSF4440, TSF4445, TSF-4446, TSF4452 and TSF4460 (all manufactured by Momentive Performance Materials Inc.), FLUORINERTs (registered trademark) FC-72, FC-40, FC-43 and FC-3283 (all manufactured by Sumitomo 3M Limited); MEGAFACs (registered trademark) R-08, R-30, R-90, F-410, F-411, F-443, F-445, F-470, F-477, F-479, F-482 and F-483 (all manufactured by DIC Corporation); EFTOPs (trade name) EF301, EF303, EF351 and EF352 (all manufactured by Mitsubishi Materials Electronic Chemicals Co., Ltd.); SURFLONs (registered trademark) S-381, S-382, S-383, S-393, SC-101, SC-105, KH-40 and SA-100 (all manufactured by AGC Seimi Chemical Co., Ltd.); E1830 and E5844 (trade names) (manufactured by Daikin Fine Chemical Laboratory Co., Ltd.); and BM-1000, BM-1100, BYK-352, BYK-353 and BYK-361N (trade names) (manufactured by BM Chemie GmbH). The leveling agents can be used alone or in combination of two or more.

The content of the leveling agent is preferably 0.01 parts by mass to 5 parts by mass, more preferably 0.05 parts by mass to 3 parts by mass, based on 100 parts by mass of the polymerizable liquid crystal compound. When the content of the leveling agent is within the above range, it is made easy to horizontally orientate the polymerizable liquid crystal compound, and a liquid crystal cured film to be obtained tends to be smoother, thus it is preferred.

When an antioxidant is added, the polymerization reaction of the polymerizable liquid crystal compound can be controlled. The antioxidant may be a primary antioxidant selected from phenol-based antioxidants, amine-based antioxidants, quinone-based antioxidants, and nitroso-based antioxidants, or may be a secondary antioxidant selected from phosphorus-based antioxidants and sulfur-based antioxidants.

In order to polymerize the polymerizable liquid crystal compound without disturbing the orientation of the polymerizable liquid crystal compound, the content of the antioxidant is usually 0.01 to 10 parts by mass, preferably 0.1 to 5 parts by mass, more preferably 0.1 to 3 parts by mass based on 100 parts by mass of the polymerizable liquid crystal compound.

The antioxidants can be used alone or in combination of two or more.

In addition, the sensitivity of the photopolymerization initiator can be increased by using a photosensitizer. Examples of the photosensitizer include xanthones such as xanthone and thioxanthone; anthracene and anthracenes having a substituent such as alkyl ether; phenothiazine; and rubrene. The photosensitizers can be used alone or in combination of two or more. The content of the photosensitizer is usually 0.01 to 10 parts by mass, preferably 0.05 to 5 parts by mass, more preferably 0.1 to 3 parts by mass based on 100 parts by mass of the polymerizable liquid crystal compound.

The polymerizable liquid crystal composition can be obtained by, for example, stirring the polymerizable liquid crystal compound and components other than the polymerizable liquid crystal compound such as a solvent and a photopolymerization initiator at a predetermined temperature.

In the present invention, the horizontally oriented liquid crystal cured film can be produced by, for example, a method including
- a step of forming a coating film of a polymerizable liquid crystal composition containing at least one type of polymerizable liquid crystal compound and orienting the polymerizable liquid crystal compound horizontally with respect to a plane of the coating film (the step is hereinafter also referred to as "orientation step"),
- a step of inducing orientation melting of the horizontally oriented polymerizable liquid crystal compound (the step is hereinafter also referred to as "orientation melting step"), and
- a step of, after the induction of the orientation melting, curing the polymerizable liquid crystal composition while maintaining the horizontally oriented state of the polymerizable liquid crystal compound (the step is hereinafter also referred to as "curing step").

The coating film of the polymerizable liquid crystal composition can be formed by applying the polymerizable liquid crystal composition on a base material, an orientation film described later, or the like.

Examples of the base material include a glass base material and a film base material, and a resin film base material is preferred from the viewpoint of processability. Examples of the resin constituting the film base material include plastics, for example, polyolefins such as polyethylene, polypropylene, and norbornene-based polymer; a cycloolefin-based resin; polyvinyl alcohol; polyethylene terephthalate; a polymethacrylic acid ester; a polyacrylic acid ester; cellulose esters such as triacetyl cellulose, diacetyl cellulose, and cellulose acetate propionate; polyethylene naphthalate; polycarbonate; polysulfone; polyether sulfone; polyether ketone; polyphenylenesulfide and polyphenylene oxide. Such a resin can be formed into a film by a conventional means such as a solvent casting method or a melt extrusion method to obtain a base material. A surface of the base material may have a protective layer formed from acrylic resin, methacrylic resin, epoxy resin, oxetane resin, urethane resin, melamine resin, etc., and may be subjected to mold release treatment such as silicone treatment and surface treatment such as corona treatment and plasma treatment.

A commercially available product may be used as the base material. Examples of commercially available cellulose ester base materials include cellulose ester base materials manufactured by FUJIFILM Corporation, such as Fujitac film; and cellulose ester base materials manufactured by Konica Minolta Opto Products Co., Ltd., such as "KC8UX2M", "KC8UY", and "KC4UY". Examples of the commercially available cycloolefin-based resin include cycloolefin-based resins manufactured by Ticona (Germany), such as "Topas (registered trademark)", cycloolefin-based resins manufactured by JSR Corporation, such as "ARTON (registered trademark)"; cycloolefin-based resins manufactured by Zeon Corporation, such as "ZEONOR (registered trademark)" and "ZEONEX (registered trademark)", and cycloolefin-based resins manufactured by Mitsui Chemicals, Inc., such as "APEL" (registered trademark). Commercially available cycloolefin-based resin base materials can also be used. Examples of the commercially available cycloolefin-based resin base material include cycloolefin-based resin base materials manufactured by Sekisui Chemical Co., Ltd, such as "Escena (registered trademark)" and "SCA40 (registered trademark)"; cycloolefin-based resin base materials manufactured by Optes Co., Ltd., such as "ZEONOR film (registered trademark)"; and cycloolefin-based resin base materials manufactured by JSR Corporation, such as "ARTON film (registered trademark)".

From the viewpoints of thinning the laminate, easy peeling of the base material, handleability of the base material, and the like, the thickness of the base material is usually 5 to 300 μm, and preferably 10 to 150 μm.

Examples of the method for applying a polarizable liquid crystal composition onto the base material and the like include known methods such as: coating methods including a spin coating method, extrusion method, gravure coating method, die coating method, bar coating method, applicator method, etc.; and printing methods including a flexographic method.

Next, the coating film obtained from the polymerizable liquid crystal composition is heated to a temperature equal to or higher than a nematic phase transition temperature of the polymerizable liquid crystal compound contained in the polymerizable liquid crystal composition to dry and remove the solvent from the coating film and to orient the polymerizable liquid crystal compound in the horizontal direction. It is generally known that the nematic phase transition temperature of the polymerizable liquid crystal compound in the polymerizable liquid crystal composition may be lower than the nematic phase transition temperature of the polymerizable liquid crystal compound as a single substance.

The heating temperature of the coating film can be appropriately determined in consideration of the polymerizable liquid crystal compound to be used and the material of the base material or the like forming the coating film. However, it is necessary that the heating temperature is equal to or higher than a liquid crystal phase transition temperature in order to perform phase transition of the polymerizable liquid crystal compound to a liquid crystal layer state. Since the polymerizable liquid crystal compound is placed in a horizontally oriented state while removing the solvent contained in the polymerizable liquid crystal composition, the heating temperature is preferably a temperature higher by 3° C. or more than the nematic phase transition temperature of the polymerizable liquid crystal compound, and more preferably a temperature higher by 5° C. or more than the nematic phase transition temperature. The upper limit of the heating temperature is not particularly limited, and is preferably 180° C. or lower, more preferably 150° C. or lower in order to avoid damage to the coating film, the base material, etc. due to heating.

The nematic phase transition temperature can be measured using, for example, a polarizing microscope equipped with a temperature control stage, a differential scanning calorimeter (DSC), a thermogravimetric differential thermal analyzer (TG-DTA), and the like. When two or more types of polymerizable liquid crystal compounds are used in combination, using a mixture of the polymerizable liquid crystal compound in which all polymerizable liquid crystal compounds constituting the polymerizable liquid crystal composition are mixed at the same ratio as the composition in the polymerizable liquid crystal composition, the phase transition temperature means a temperature measured in the same way as when using one type of polymerizable liquid crystal compound.

A heating time can be appropriately determined depending on the heating temperature, the type of the polymerizable liquid crystal compound to be used, the type of the solvent, the boiling point and amount thereof, etc., and is usually 15 seconds to 10 minutes, and preferably 0.5 to 5 minutes.

The solvent may be removed from the coating film at the same time as heating the polymerizable liquid crystal compound to a temperature equal to or higher than the nematic phase transition temperature, or separately. However, it is preferred to remove the solvent at the same time as heating from the viewpoint of improving productivity. Before heating the polymerizable liquid crystal compound to the temperature equal to or higher than the nematic phase transition temperature, a pre-drying step may be provided for suitably removing the solvent in the coating film under a condition that the polymerizable liquid crystal compound contained in the coating film obtained from the polymerizable liquid crystal composition does not polymerize. Examples of a drying method in the pre-drying step include a natural drying method, a ventilation drying method, heat drying, and a reduced-pressure drying method. A drying temperature (heating temperature) in the drying step can be appropriately determined depending on the type of polymerizable liquid crystal compound to be used, the type of the solvent, the boiling point and amount thereof, etc.

In the present invention, the method of producing a horizontally oriented liquid crystal cured film includes a step of inducing orientation melting of a horizontally oriented polymerizable liquid crystal compound. Here, the "step of inducing orientation melting of a horizontally oriented polymerizable liquid crystal compound" is a step of performing treatment for controlling the orientation of the polymerizable liquid crystal compound so that the refractive index nyA in the direction orthogonal to the direction of nxA in the plane of the liquid crystal cured film to be obtained is larger than the refractive index nzA in the direction perpendicular to the plane of the liquid crystal cured film. This step is conducted by controlling directionality (orientation) of constituent molecules arranged in the direction intersecting with the major axis direction of the polymerizable liquid crystal compound having a T-shaped structure as described above for the polymerizable liquid crystal compound, particularly, for the polymerizable liquid crystal compound exhibiting the reverse wavelength dispersibility so as to make the refractive index nyA in the direction orthogonal to the direction of nxA in the plane of the liquid crystal cured film larger than the refractive index nzA in the direction perpendicular to the plane of the liquid crystal cured film. In this step, presumably heating the coating film of the polymerizable liquid crystal composition or exposing the coating film to a solvent atmosphere makes the molecules of the polymerizable liquid crystal compound move so that the constituent molecules arranged in the direction intersecting with the major axis direction of the polymerizable liquid crystal compound are likely to be oriented in a certain direction.

The step of inducing orientation melting may be a step of performing treatment for controlling the orientation of the polymerizable liquid crystal compound so that the refractive index nyA in the direction orthogonal to the direction of nxA in the plane of the liquid crystal cured film to be obtained becomes larger than the refractive index nzA in the direction perpendicular to the plane of the liquid crystal cured film. Examples include (I) a method (also referred to as a slow cooling step) of heating at a temperature lower than the nematic phase transition temperature of the polymerizable liquid crystal compound and a room temperature or higher after the orientation step and (II) a method of drying the coating film of the polymerizable liquid crystal composition in a solvent atmosphere.

In the above method (I), the heating temperature can be appropriately determined in consideration of the polymerizable liquid crystal compound to be used and the material of the base material or the like forming the coating film. The heating temperature is preferably room temperature (20° C.) or higher, more preferably 30° C. or higher, further preferably 40° C. or higher, and preferably a temperature lower by 3° C. or more than the nematic phase transition temperature of the polymerizable liquid crystal compound, and more preferably a temperature lower by 5° C. or more than the nematic phase transition temperature. The upper limit of the heating temperature is not particularly limited, and is preferably 150° C. or lower, more preferably 120° C. or lower in order to avoid damage to the coating film, the base material, etc. due to heating.

The heating time can be appropriately determined depending on the heating temperature, the type of the polymerizable liquid crystal compound to be used, etc. However, if the heating time is too long, crystallization progresses, so that the heating time is preferably 1 to 120 seconds, and more preferably 10 to 60 seconds.

The heating according to the above method (I) can be performed by heating at the temperature equal to or higher than the nematic phase transition temperature of the polymerizable liquid crystal compound in the orientation step, then cooling the coating film to a desired temperature that is lower than the nematic phase transition temperature and a room temperature or higher, and holding the desired temperature for a certain period of time. Furthermore, the heating according to the above method (I) may be performed by heating at the temperature equal to or higher than the nematic phase transition temperature of the polymerizable liquid crystal compound in the orientation step, then cooling the coating film to an arbitrary temperature such as a room temperature, and then heating the coating film again to the desired temperature that is lower than the nematic phase transition temperature and a room temperature or higher.

When the above method (II) is used, the orientation melting step may be performed at the same time as the orientation step, or may be performed after the orientation step. The coating film can be dried in a solvent atmosphere by natural drying, ventilation drying, heat drying, reduced-pressure drying, or the like. By drying the coating film while filling an inside of a reaction vessel with a solvent that volatilizes from the coating film by heating the coating film in the orientation step, the orientation melting step can be performed with high productivity. When the orientation melting step is performed at the same time as the orientation step, the drying temperature of the coating film is preferably set to the heating condition in the orientation step described above. When the orientation melting step is performed after the orientation step, the drying temperature can be appropriately determined depending on the type of the polymerizable liquid crystal compound to be used, the type of the solvent, the amount of the solvent contained in the coating film, etc. For example, drying is performed at 20 to 180° C. for 15 seconds to 10 minutes, and drying is preferably performed at 50 to 120° C. for 30 seconds to 5 minutes.

A solvent concentration in the solvent atmosphere is preferably 0.0001 to 1 mg/cm$^3$, more preferably 0.001 to 0.5 mg/cm$^3$, and further preferably 0.01 to 0.3 mg/cm$^3$.

Either of the above methods (I) and (II) may be performed alone, or both methods may be combined as long as the effects of the present invention are not impaired. From the viewpoint of ease of operation and safety, preferably the orientation melting step is performed by the method (I) of heating at the temperature lower than the nematic phase transition temperature of the polymerizable liquid crystal compound and a room temperature or higher after the orientation step.

Next, in the dried coating film after the induction of the orientation melting, the horizontally oriented liquid crystal cured film is formed by polymerizing the polymerizable liquid crystal compound while maintaining the horizontally oriented state of the polymerizable liquid crystal compound. Examples of the polymerization method include a thermal polymerization method and a photopolymerization method, and the photopolymerization method is preferred from the viewpoint of easily controlling the polymerization reaction. In photopolymerization, the light with which the dried coating film is irradiated is appropriately selected depending on the type of the photopolymerization initiator contained in the dried coating film, the type of the polymerizable liquid crystal compound (particularly, the type of the polymerizable group held by the polymerizable liquid crystal compound), and the amounts thereof. Specific examples of the light include one or more types of light or active electron beams selected from the group consisting of visible light, ultraviolet light, infrared light, X-rays, $\alpha$-rays, $\beta$-rays, and $\gamma$-rays. Among them, ultraviolet light is preferred because it is easy to control the progress of a polymerization reaction and a photopolymerization apparatus widely used in the field can be used. And, it is preferred to select the types of the polymerizable liquid crystal compound and the photopolymerization initiator contained in the polymerizable liquid crystal composition, so that photopolymerization can be performed by ultraviolet light. At the time of polymerization, a polymerization temperature can also be controlled by irradiating light while cooling the dried coating film with a suitable cooling unit. When the polymerizable liquid crystal compound is polymerized at a lower temperature by adopting such a cooling unit, a horizontally oriented liquid crystal cured film can be properly formed even if a base material having a relatively low heat resistance is used. The polymerization reaction can also be promoted by raising the polymerization temperature within a range in which defects (deformation of the base material due to heat, etc.) due to heat during light irradiation do not occur. A patterned cured film can also be obtained by performing masking and development, etc., in the photopolymerization.

Examples of light sources of the active energy rays include a low pressure mercury lamp, a medium pressure mercury lamp, a high pressure mercury lamp, an ultrahigh pressure mercury lamp, a xenon lamp, a halogen lamp, a carbon arc lamp, a tungsten lamp, a gallium lamp, an excimer laser, an LED light source emitting light in a wavelength range of 380 nm to 440 nm, a chemical lamp, a black light lamp, a microwave-excited mercury lamp, and a metal halide lamp.

An ultraviolet irradiation intensity is usually 10 to 3,000 mW/cm$^2$. It is preferred that the ultraviolet irradiation intensity is an intensity within a wavelength region effective for activating the photopolymerization initiator. A period for irradiating the light is usually 0.1 seconds to 10 minutes, preferably 0.1 seconds to 5 minutes, more preferably 0.1 seconds to 3 minutes, and further preferably 0.1 seconds to 1 minute. When ultraviolet rays are irradiated once or multiple times with such an ultraviolet irradiation intensity, the integrated amount of the light is 10 to 3,000 mJ/cm$^2$, preferably 50 to 2,000 mJ/cm$^2$, and more preferably 100 to 1,000 mJ/cm$^2$.

The thickness of the horizontally oriented liquid crystal cured film can be appropriately selected depending on a display device to be adopted, and is preferably 0.5 to 5 µm, more preferably 0.8 to 4 µm, and further preferably 1.0 to 3.5 µm.

The coating film of the polymerizable liquid crystal composition is preferably formed on the orientation film. The orientation film has an orientation regulating force by which the polymerizable liquid crystal compound is liquid-crystal-oriented in a desired direction. Among these, an orientation film having an orientation regulating force by which the polymerizable liquid crystal compound is oriented in the horizontal direction may be referred to as a horizontal orientation film, and an orientation film having an orientation regulating force by which the polymerizable liquid crystal compound is oriented in the vertical direction may be referred to as a vertical orientation film. The orientation regulating force can be arbitrarily adjusted according to the type of orientation film, surface conditions, rubbing conditions, etc., and when the orientation film is formed from a photo-orientational polymer, the orientation regulating force can be arbitrarily adjusted according to polarization irradiation conditions, etc.

Preferably, the orientation film has a solvent resistance with which it does not dissolve when a polymerizable liquid crystal composition is applied, etc., and has a heat resistance for a heat treatment for removing the solvent or orienting the polymerizable liquid crystal compound described later. Examples of the orientation film include an orientation film containing an orientation polymer, a photo-orientation film, a groove orientation film having an uneven pattern or a plurality of grooves on the surface, and a drawn film drawn in the orientation direction, and a photo-orientation film is preferred from the viewpoint of accuracy of an orientation angle and the quality.

Examples of the orientational polymer include polyamide and gelatins having an amide bond in the molecule, polyimide having an imide bond in the molecule and a polyamic acid which is a hydrolyzed product of the polyimide, polyvinyl alcohol, alkyl-modified polyvinyl alcohol, polyacrylamide, polyoxazole, polyethyleneimine, polystyrene, polyvinyl pyrrolidone, polyacrylic acid, and a polyacrylic acid esters. Among them, polyvinyl alcohol is preferred. The orientational polymers can be used alone or in combination of two or more.

The orientation film containing an orientational polymer can be usually obtained by applying a composition containing an orientational polymer dissolved in a solvent (hereinafter, may also be referred to as "orientational polymer composition") to a base material and removing the solvent, or by applying an orientational polymer composition to a base material, removing the solvent, and rubbing the composition (rubbing method). Examples of the solvent include the same solvents as those exemplified above as the solvents that can be used for the polymerizable liquid crystal composition.

The concentration of the orientational polymer in the orientational polymer composition should be within a range in which an orientational polymer material can be completely dissolved in a solvent, and it is preferably 0.1 to 20% and more preferably about 0.1 to 10% in terms of the solid content with respect to the solution.

As the orientational polymer composition, a commercially available orientation film material may be used as it is. Examples of the commercially available orientation film material include SUNEVER (registered trademark, manufactured by Nissan Chemical Industries, Ltd.) and OPTOMER (registered trademark, manufactured by JSR Corporation).

Examples of the method of applying the orientational polymer composition to the base material include the same method as the method of applying the polymerizable liquid crystal composition to the base material.

Examples of the method of removing the solvent contained in the orientational polymer composition include a natural drying method, a ventilation drying method, heat drying, and a reduced-pressure drying method.

To provide the orientation film with an orientation controlling force, rubbing treatment can be conducted (rubbing method) if necessary. Examples of the method of providing the orientation controlling force by the rubbing method include a method for bringing a film of the orientational polymer, which is formed on the base material surface by applying the orientational polymer composition to the base material and annealing the orientational polymer composition, into contact with a rotating rubbing roll around which a rubbing cloth is wound. In the rubbing treatment, it is also possible to form an orientation film having multiple areas (patterns) with different orientation directions by a masking treatment.

The photo-orientation film can usually be obtained by applying a composition containing both a polymer or monomer having a photoreactive group and a solvent (hereinafter, also referred to as a "photo-orientation film-forming composition") onto a base material, removing the solvent, and then irradiating polarized light (preferably, polarized UV). The photo-orientation film is also advantageous because the direction of the orientation regulating force can be arbitrarily controlled by selecting the polarization direction of polarized light to be irradiated.

The photoreactive group refers to a group that generates a liquid crystal orientation ability when irradiated with light. Specific examples thereof include groups involved in photoreactions that are the origin of the liquid crystal orientation ability, such as a molecular orientation induction or isomerization reaction, dimerization reaction, photocrosslinking reaction, or photodecomposition reaction, which are generated by light irradiation. Among them, a group involved in the dimerization reaction or photocrosslinking reaction is preferred because it is excellent in orientation. The photoreactive group is preferably a group having an unsaturated bond, particularly a double bond, and particularly preferably a group having at least one selected from the group consisting of a carbon-carbon double bond (C=C bond), carbon-nitrogen double bond (C=N bond), nitrogen-nitrogen double bond (N=N bond), and carbon-oxygen double bond (C=O bond).

Examples of the photoreactive group having a C=C bond include a vinyl group, polyene group, stilbene group, stilbazole group, stilbazolium group, chalcone group, and cinnamoyl group.

Examples of the photoreactive group having a C=N bond include groups having a structure such as an aromatic Schiff base or aromatic hydrazone. Examples of the photoreactive group having an N=N bond include an azobenzene group, azonaphthalene group, aromatic heterocyclic azo group, bisazo group, formazan group, and group having an azoxybenzene structure. Examples of the photoreactive group having a C=O bond include a benzophenone group, coumarin group, anthraquinone group, and maleimide group. These groups may have substituents such as an alkyl group, alkoxy group, aryl group, allyloxy group, cyano group, alkoxycarbonyl group, hydroxyl group, sulfonic acid group, and halogenated alkyl group.

Among them, a photoreactive group involved in a photodimerization reaction is preferred, and a cinnamoyle group and a chalcone group are preferred because a photo-orientation film, having a relatively small irradiation amount of polarized light necessary for photo orientation and being excellent in thermal stability and over-time stability, can be easily obtained. It is particularly preferred to adopt, as the polymer having the photoreactive group, a polymer having a cinnamoyl group such that the end of the side chain of the polymer has a cinnamic acid structure.

By applying the photo-orientation film-forming composition onto a base material, a photo-orientation induction layer can be formed on the base material. Examples of the solvent contained in the composition include the same solvents as those described above as the solvent that can be used for the polymerizable liquid crystal composition. The solvent can be appropriately selected depending on the solubility of the polymer or monomer having the photoreactive group.

The content of the polymer or monomer having the photoreactive group in the photo-orientation film-forming composition can be appropriately adjusted depending on the type of the polymer or monomer and the thickness of the target photo-orientation film. The content thereof is preferably at least 0.2% by mass, and more preferably within the range from 0.3 to 10% by mass, based on the mass of the photo-orientation film-forming composition. The photo-orientation film-forming composition may contain a polymer material, such as polyvinyl alcohol or polyimide, and a photosensitizer within a range where the characteristics of the photo-orientation film are not significantly impaired.

Examples of the method of applying the photo-orientation film-forming composition to the base material include the same method as that of applying the orientational polymer composition to the base material. Examples of the method of removing the solvent from the applied photo-orientation film-forming composition include a natural drying method, a ventilation drying method, heat drying, and a reduced-pressure drying method.

Irradiation of polarized light may be performed in a mode in which polarized UV is directly irradiated onto what is obtained by removing the solvent from the photo-orientation film-forming composition applied onto the base material, or in a mode in which the polarized light, which has been irradiated from the base material side, is irradiated by being transmitted therethrough. It is particularly preferred that the polarized light is substantially parallel light. It is preferred that the wavelength of the polarized light to be irradiated is within a wavelength range where a photoreactive group of a polymer or monomer having the photoreactive group can absorb light energy. Specifically, UV (ultraviolet ray) having a wavelength within the range from 250 to 400 nm is particularly preferred. Examples of the light source to be used for irradiating the polarized light include a xenon lamp, high-pressure mercury lamp, ultra-high-pressure mercury lamp, metal halide lamp, and ultraviolet light laser such as KrF or ArF. A high-pressure mercury lamp, ultra-high-pressure mercury lamp, and metal halide lamp are more preferred. Among them, a high-pressure mercury lamp, ultra-high-pressure mercury lamp, and metal halide lamp are preferred because they have a high emission intensity of an ultraviolet ray having a wavelength of 313 nm. Polarized UV can be irradiated by irradiating the light from the light source through an appropriate polarizer. As such a polarizer, a polarizing filter, polarizing prisms such as Glan-Thompson and Glan-Taylor, and a wire grid type polarizer can be used.

When masking is performed during rubbing or polarized light irradiation, a plurality of regions (patterns), where the directions of liquid crystal orientation are different, can be formed.

A groove orientation film is a film having an unevenness pattern or multiple grooves on its surface. When a polymerizable liquid crystal compound is applied on a film having multiple linear grooves at equal intervals, the liquid crystal molecules are oriented in the direction along the grooves.

Examples of a method for obtaining the groove orientation film include a method in which after exposure on a surface of a photoreactive polyimide film through an exposure mask having a slit in a pattern form, development and rinsing treatments are carried out to form an unevenness pattern; a method in which a UV-curable resin layer before cured is formed on a plate-shaped base board having grooves on its surface, and the formed resin layer is transferred onto a base material and then cured; and a method in which a film of a UV-curable resin before cured, which is formed on a base material, is pressed onto a roll-shaped base board having multiple grooves to form unevenness and then cured.

The thickness of the orientation film (orientation film containing an orientational polymer or photo-orientation film) is usually in a range of 10 to 10000 nm, preferably in a range of 10 to 1000 nm, more preferably 10 to 500 nm or less, further preferably in a range of 10 to 300 nm, and particularly preferably in a range of 50 to 250 nm.

The laminate of the present invention includes a vertically oriented liquid crystal cured film as well as a horizontally oriented liquid crystal cured film having the above-mentioned specific optical characteristics. The vertically oriented liquid crystal cured film is a layer formed from a cured material of the polymerizable liquid crystal composition containing the polymerizable liquid crystal compound in a state of being oriented in the direction perpendicular to the plane of the liquid crystal cured film. A three-dimensional refractive index ellipsoid formed by the vertically oriented liquid crystal cured film may have biaxiality, but preferably has uniaxiality. The vertically oriented liquid crystal cured film is preferably a positive C plate.

When the vertically oriented liquid crystal cured film is the positive C plate, the vertically oriented liquid crystal cured film satisfies a formula (8) in a refractive index ellipsoid formed by the vertically oriented liquid crystal cured film.

$$nzC(\lambda) > nxC(\lambda) \approx nyC(\lambda) \tag{8}$$

[In the formula, nzA(λ) represents a main refractive index at a wavelength of λ nm in the film surface of the vertically oriented liquid crystal cured film, nyC(λ) represents a refractive index at a wavelength of λ nm in a direction orthogonal to a direction of nxC in the same plane as nxC, and nzC(λ) represents a refractive index at a wavelength of λ nm in the film thickness direction of the vertically oriented liquid crystal cured film.

Generally, when an optical axis of a rod-shaped polymerizable liquid crystal is oriented so as to be perpendicular to the plane of the liquid crystal cured film to be obtained, a refractive index relationship of the liquid crystal cured film to be obtained film becomes the positive C plate. Therefore, a rod-shaped polymerizable liquid crystal compound is preferred as the polymerizable liquid crystal compound that forms the vertically oriented liquid crystal cured film constituting the laminate of the present invention.

As the rod-shaped polymerizable liquid crystal compound for forming the vertically oriented liquid crystal cured film, a polymerizable liquid crystal compound conventionally known in the field of phase difference film can be used. Examples of such a polymerizable liquid crystal compound include a compound represented by (λ) described above and a compound including a group represented by the following formula (B) (hereinafter, also referred to as a "polymerizable liquid crystal compound (B)").

The polymerizable liquid crystal compound can be used alone or in combination of two or more.

$$P11-B11-E11-B12-A11-B13- \tag{B}$$

[In the formula (B), P11 represents a polymerizable group. A11 represents a divalent alicyclic hydrocarbon group or a divalent aromatic hydrocarbon group. The hydrogen atom contained in the divalent alicyclic hydrocarbon group and the divalent aromatic hydrocarbon group may be substituted with a halogen atom, alkyl group having 1 to 6 carbon atoms, alkoxy group having 1 to 6 carbon atoms, cyano group, or nitro group. The hydrogen atom contained in the alkyl group having 1 to 6 carbon atoms and the alkoxy group having 1 to 6 carbon atoms may be substituted with a fluorine atom.

B11 represents —O—, —S—, —CO—O—, —O—CO—, —O—CO—O—, —CO—NR$^{16}$—, —NR$^{16}$—CO—, —CO—, —CS— or represents a single bond. R$^{16}$ represents a hydrogen atom or an alkyl group having 1 to 6 carbon atoms.

B12 and B13 each independently represent —C≡—, —CH=CH—, —CH$_2$—CH$_2$—, —O—, —S—, —C(=O)—, —C(=O)—O—, —O—C(=O)—, —O—C(=O)—O—, —CH=N—, —N=CH—, —N=N—, —C(=O)—NR$^{16}$—, —NR$^{16}$—C(=O)—, —OCH$_2$—, —OCF$_2$—, —CH$_2$O—, —CF$_2$O—, —CH=CH—C(=O)—O—, —O—C(=O)—CH=CH—, or a single bond.

E11 represents an alkanediyl group having 1 to 12 carbon atoms, a hydrogen atom contained in the alkanediyl group may be substituted with an alkoxy group having 1 to 5 carbon atoms, and a hydrogen atom contained in the alkoxy group may be substituted with a halogen atom. —CH$_2$- constituting the alkanediyl group may be replaced by —O— or —CO—.]

The carbon number of the aromatic hydrocarbon group and the alicyclic hydrocarbon group of A11 is preferably in a range of 3 to 18, more preferably in a range of 5 to 12, and particularly preferably 5 or 6. As A11, a cyclohexane-1,4-diyl group and a 1,4-phenylene group are preferred.

As E11, a linear alkanediyl group having 1 to 12 carbon atoms is preferred. —CH$_2$— constituting the alkanediyl group may be replaced by —O—.

Specific examples include linear alkanediyl groups having 1 to 12 carbon atoms such as methylene group, ethylene group, propane-1,3-diyl group, butane-1,4-diyl group, pentane-1,5-diyl group, hexane-1,6-diyl group, heptane-1,7-diyl group, octane-1,8-diyl group, nonane-1,9-diyl group, decane-1,10-diyl group, undecane-1,11-diyl group and dodecane-1,12-diyl group; —CH$_2$—CH$_2$—O—CH$_2$—CH$_2$—, —CH$_2$—CH$_2$—O—CH$_2$—CH$_2$—O—CH$_2$—CH$_2$—, and —CH$_2$—CH$_2$—O—CH$_2$—CH$_2$—O—CH$_2$—CH$_2$—O—CH$_2$—CH$_2$—.

As B11, —O—, —S—, —CO—O—, and —O—CO— are preferred, and, among these, —CO—O— is more preferred.

As B12 and B13, each independently, —O—, —S—, —C(=O)—, —C(=O)—O—, —O—C(=O)—, and —O—C(=O)—O— are preferred, and, among these, —O— or —O—C(=O)—O— is more preferred.

As the polymerizable group represented by P11, a radically polymerizable group or a cationically polymerizable group is preferred in terms of high polymerization reactivity, particularly high photopolymerization reactivity. The polymerizable group is preferably a group represented by the following formulas (P-11) to (P-15) because it is easy to handle and the production itself of the liquid crystal compound is also easy.

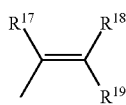
(P-11)

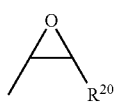
(P-12)

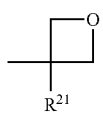
(P-13)

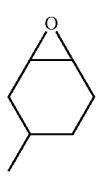
(P-14)

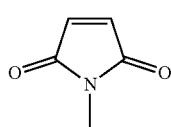
(P-15)

[In the formulas (P-11) to (P-15),
R$^{17}$ to R$^{21}$ each independently represent an alkyl group or a hydrogen atom having 1 to 6 carbon atoms.]

Specific examples of the groups represented by the formulas (P-11) to (P-15) include groups represented by the following formulas (P-16) to (P-20):

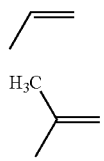
(P-16)

(P-17)

(P-18)

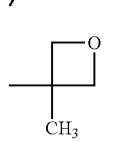
(P-19)

(P-20)

P11 is preferably a group represented by the formulas (P-14) to (P-20), and more preferably a vinyl group, a p-stilbene group, an epoxy group or an oxetanyl group.

A group represented by P11-B11- is further preferably an acryloyloxy group or a metaacryloyloxy group.

Examples of the polymerizable liquid crystal compound (B) include compounds represented by the formula (I), the formula (II), the formula (III), the formula (IV), the formula (V) or the formula (VI).

| | |
|---|---|
| P11-B11-E11-B12-A11-B13-A12-B14-A13-B15-A14-B16-E12-B17-P12 | (I) |
| P11-B11-E11-B12-A11-B13-A12-B14-A13-B15-A14-F11 | (II) |
| P11-B11-E11-B12-A11-B13-A12-B14-A13-B15-E12-B17-P12 | (III) |
| P11-B11-E11-B12-A11-B13-A12-B14-A13-F11 | (IV) |
| P11-B11-E11-B12-A11-B13-A12-B14-E12-B17-P12 | (V) |
| P11-B11-E11-B12-A11-B13-A12-F11 | (VI) |

(In the formula,
A12 to A14 are each independently synonymous with A11, B14 to B16 are each independently synonymous with B12, B17 is synonymous with B11, and E12 is synonymous with E11.
F11 represents a hydrogen atom, an alkyl group having 1 to 13 carbon atoms, an alkoxy group having 1 to 13 carbon atoms, a cyano group, a nitro group, a trifluoromethyl group, a dimethylamino group, a hydroxy group, a methylol group, a formyl group, a sulfo group (—SO$_3$H), a carboxy group, an alkoxycarbonyl group having 1 to 10 carbon atoms or a halogen atom, and —CH$_2$— constituting the alkyl group and the alkoxy group may be replaced with —O—.)

Specific examples the polymerizable liquid crystal compound (B) include compounds having a polymerizable group among the compounds described in "3.8.6 Network (Complete crosslink type)" and "6.5.1 Liquid crystal material b. Polymerizable nematic liquid crystal material" in "Liquid crystal handbook" (edited by editorial committee of Liquid crystal handbook, Maruzen Co., Ltd., Oct. 30, 2000) and the polymerizable liquid crystals described in JP-A-2010-31223, JP-A-2010-270108, JP-A-2011-6360, and JP-A-2011-207765.

Specific examples of the polymerizable liquid crystal compound (B) include compounds represented by the following formulas (I-1) to (I-4), formulas (II-1) to (II-4), formulas (III-1) to (III-26), formulas (IV-1) to (IV-26), formulas (V-1) to (V-2), and formulas (VI-1) to (VI-6). In the following formula, k1 and k2 each independently represent integers of 2 to 12. These polymerizable liquid crystal compounds (B) are preferred in terms of ease of synthesis or availability.

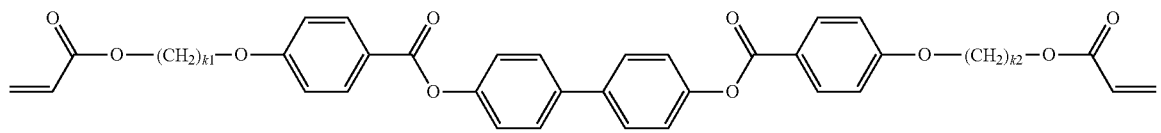
(I-1)

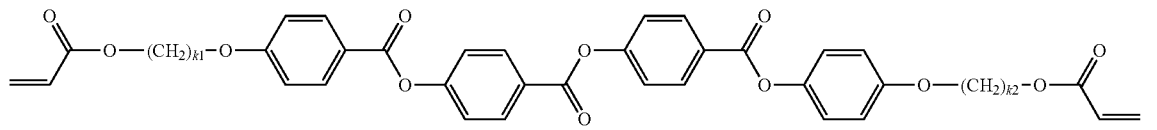
(I-2)

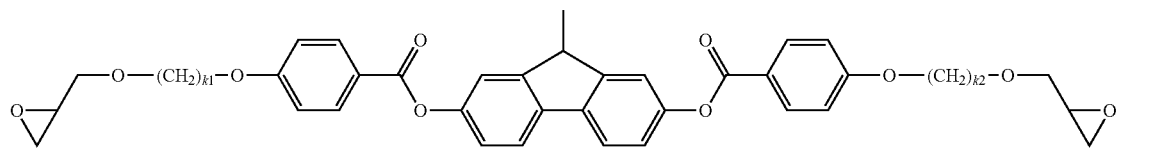
(I-3)

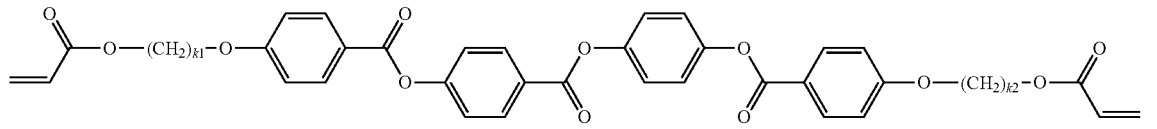
(I-4)

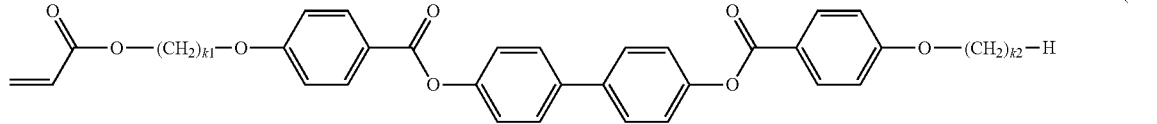
(II-1)

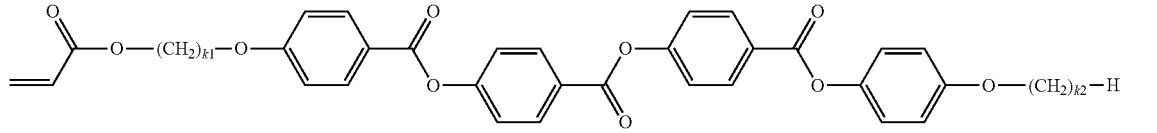
(II-2)

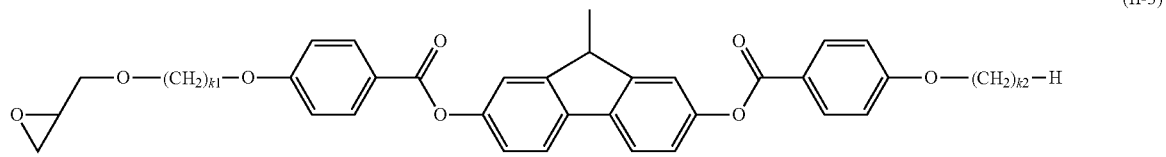
(II-3)

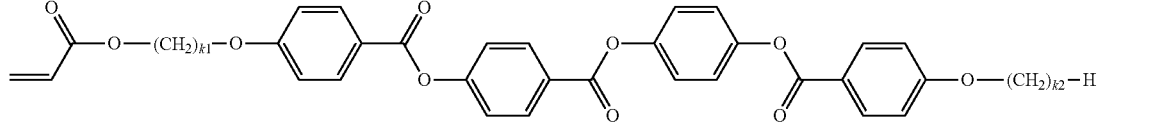
(II-4)

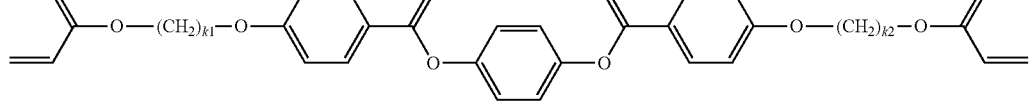
(III-1)

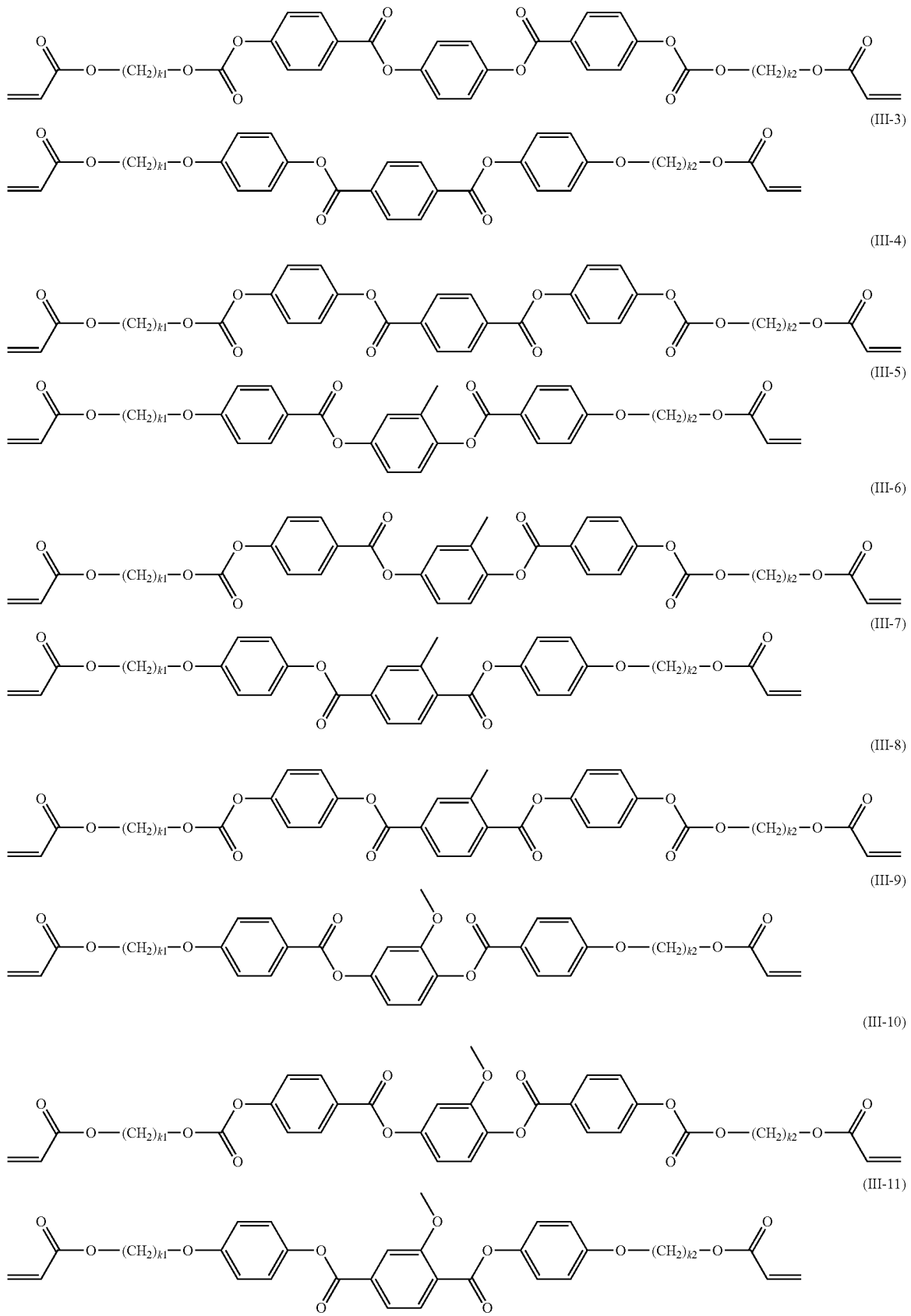

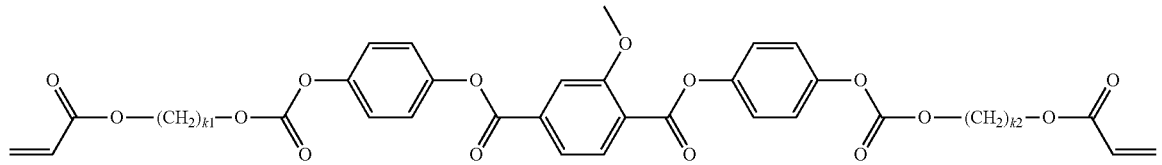
(III-12)
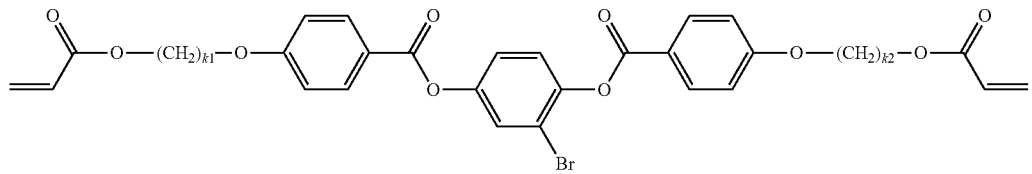
(III-13)
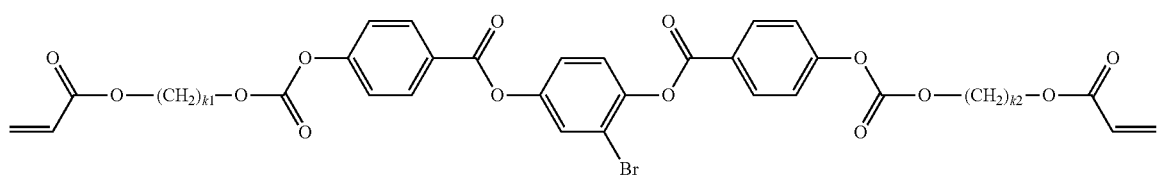
(III-14)
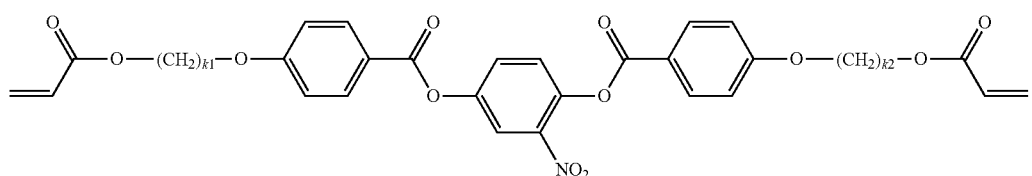
(III-15)
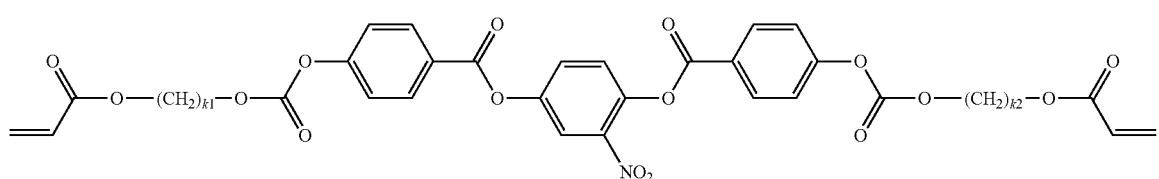
(III-16)
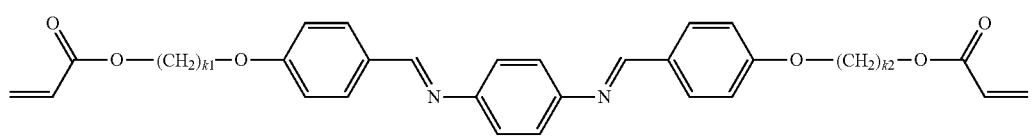
(III-17)
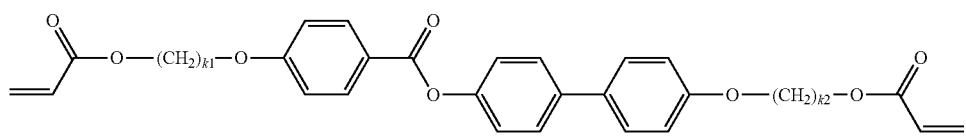
(III-18)
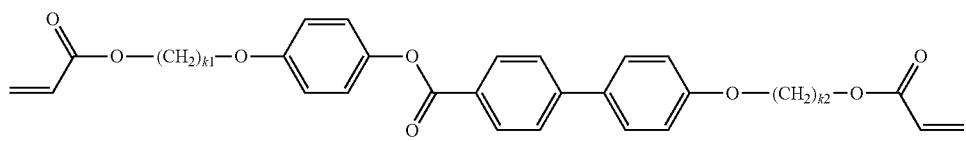
(III-19)
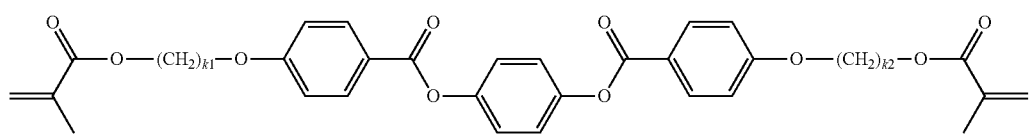
(III-20)

-continued
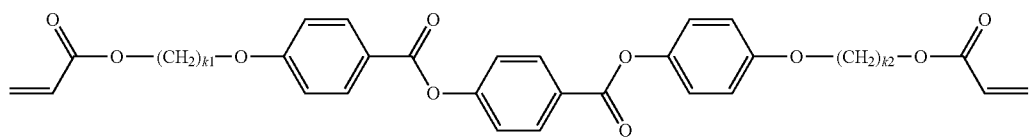
(III-21)
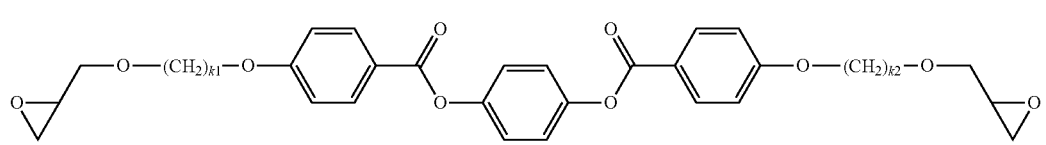
(III-22)
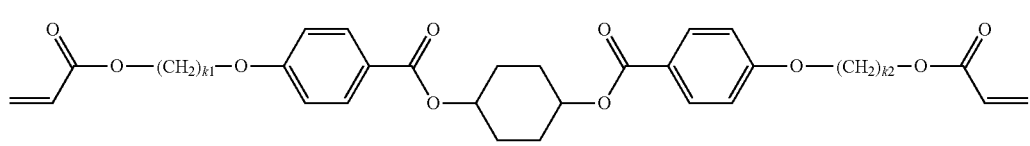
(III-23)
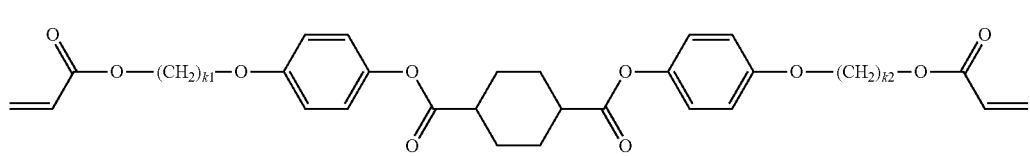
(III-24)
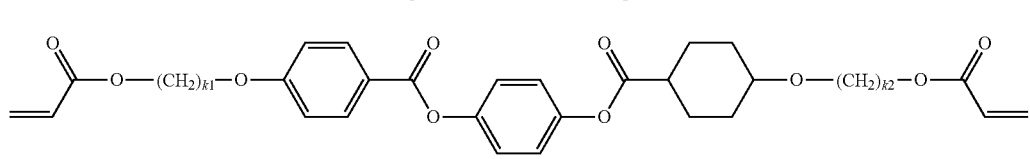
(III-25)
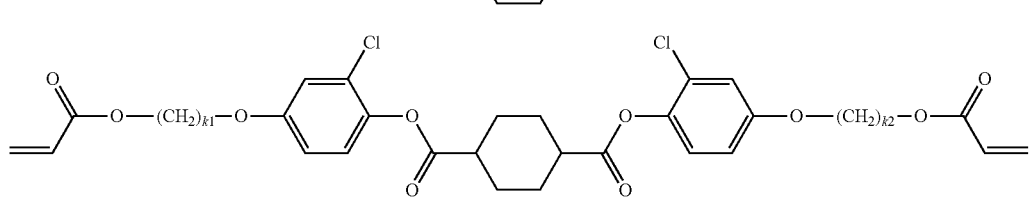
(III-26)
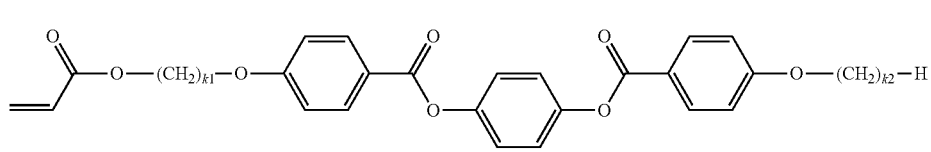
(IV-1)
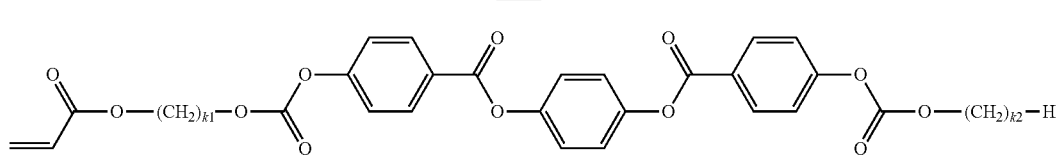
(IV-2)
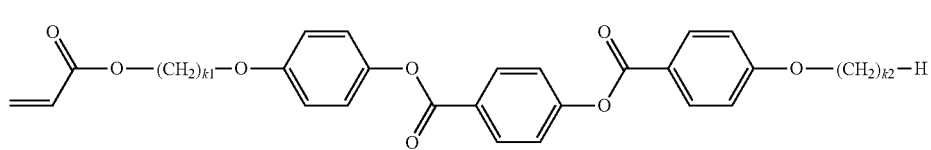
(IV-3)
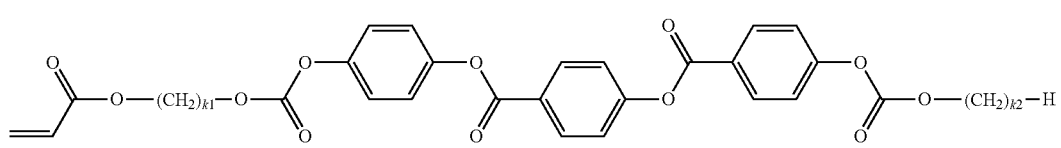
(IV-4)
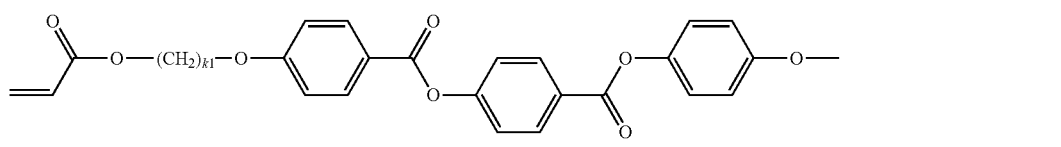
(IV-5)

-continued
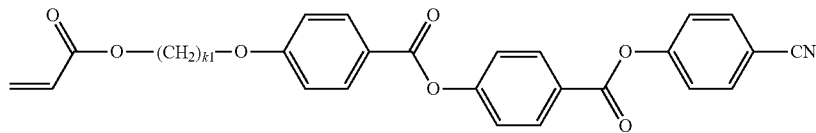 (IV-6)
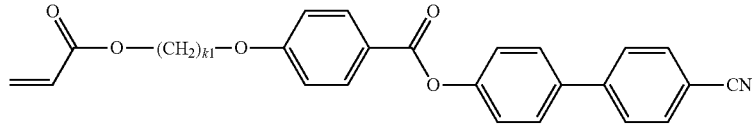 (IV-7)
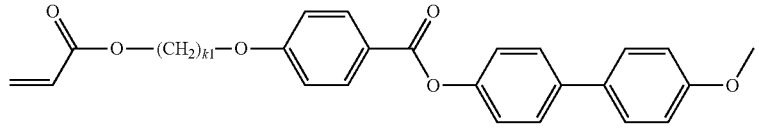 (IV-8)
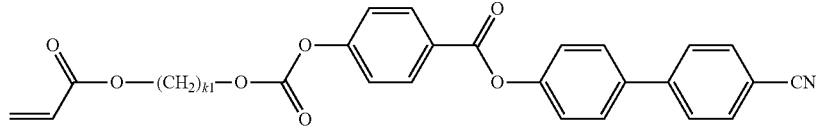 (IV-9)
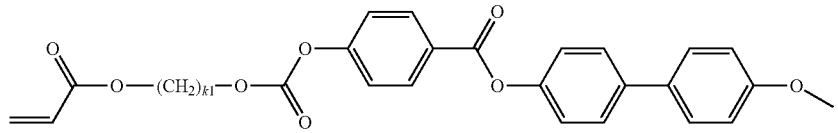 (IV-10)
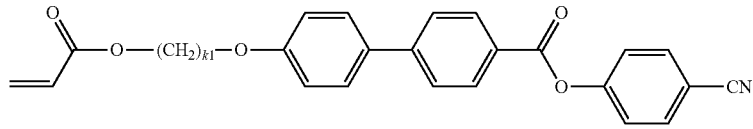 (IV-11)
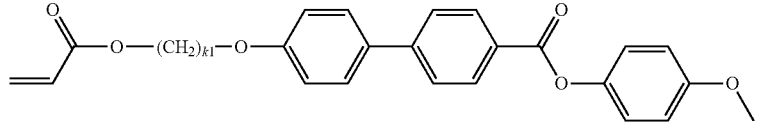 (IV-12)
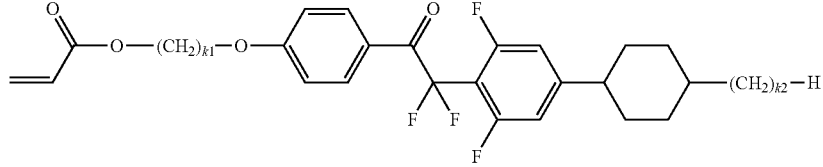 (IV-13)
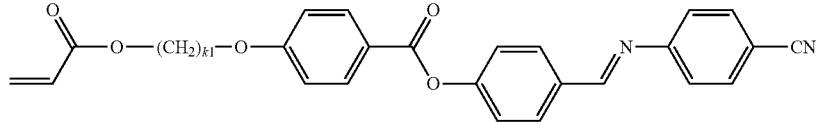 (IV-14)
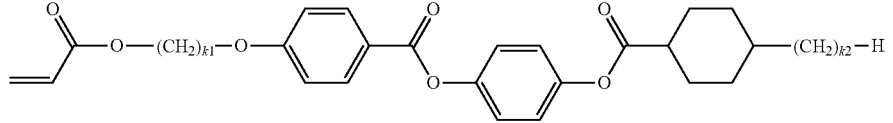 (IV-15)
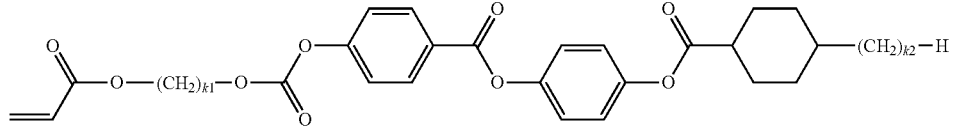 (IV-16)

-continued
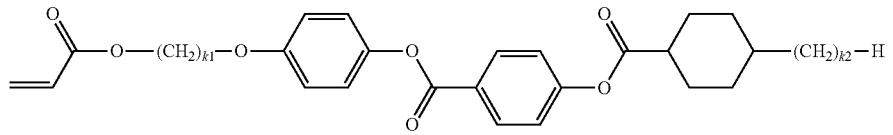 (IV-17)
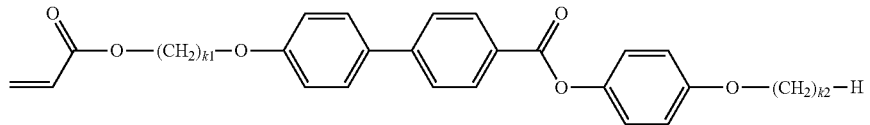 (IV-18)
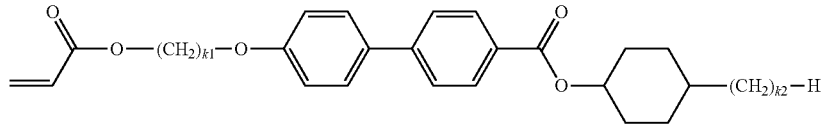 (IV-19)
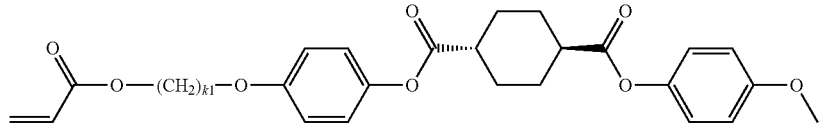 (IV-20)
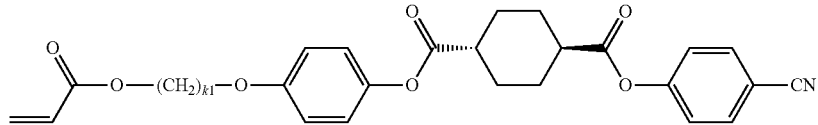 (IV-21)
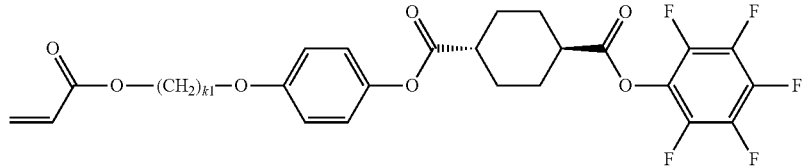 (IV-22)
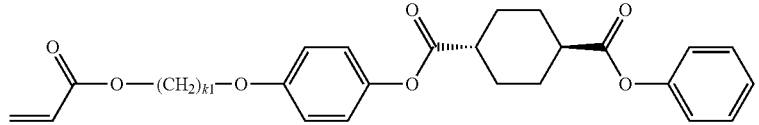 (IV-23)
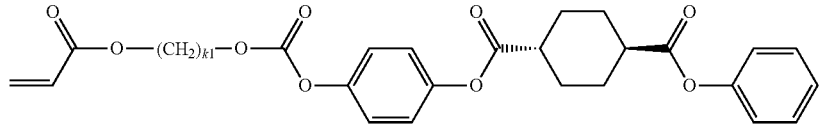 (IV-24)
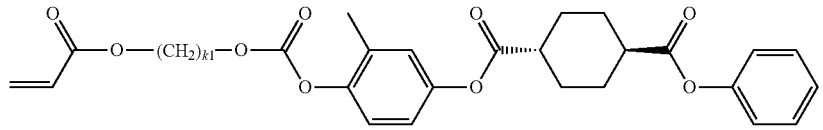 (IV-25)
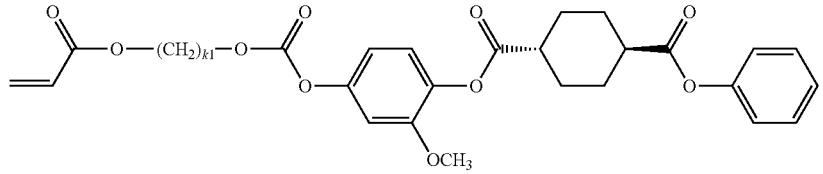 (IV-25)
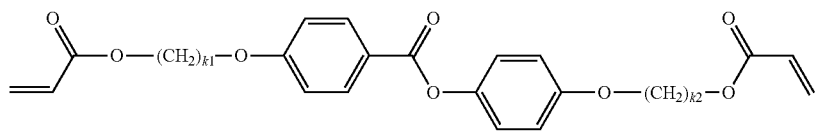 (V-1)

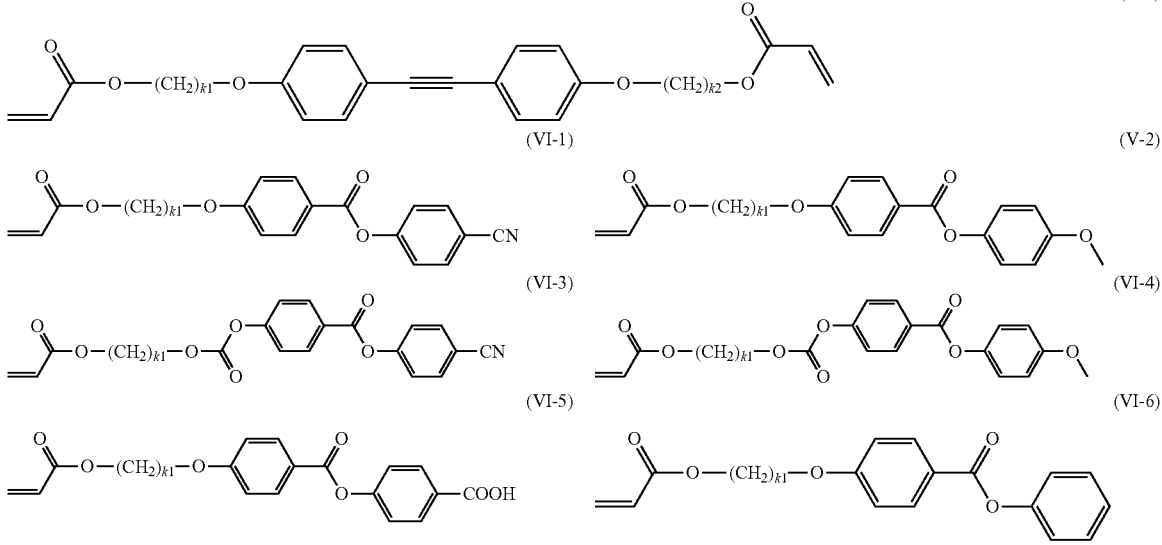

The content of the polymerizable liquid crystal compound in the polymerizable liquid crystal composition used for forming the vertically oriented liquid crystal cured film is, for example, 70 to 99.5 parts by mass, preferably 80 to 99 parts by mass, more preferably 85 to 98 parts by mass, and further preferably 90 to 95 parts by mass based on 100 parts by mass of the solid content of the polymerizable liquid crystal composition. When the content of the polymerizable liquid crystal compound is within the above range, it is advantageous from the viewpoint of the orientation of the liquid crystal cured film to be obtained.

The polymerizable liquid crystal composition used for forming the vertically oriented liquid crystal cured film may further contain additives such as a solvent, a photopolymerization initiator, a leveling agent, an antioxidant, and a photosensitizer in addition to the polymerizable liquid crystal compound. Examples of these components include the same components as those exemplified above as components that can be used in the horizontally oriented liquid crystal cured film, and each component may be used alone or in combination of two or more.

The polymerizable liquid crystal composition for forming a vertically oriented liquid crystal cured film can be obtained by, for example, stirring the polymerizable liquid crystal compound and components other than the polymerizable liquid crystal compound such as a solvent and a photopolymerization initiator at a predetermined temperature.

The vertically oriented liquid crystal cured film can be produced by, for example, a method including
  a step of applying a polymerizable liquid crystal composition for forming a vertically oriented liquid crystal cured film onto a base material or an orientation film described later to obtain a coating film,
  a step of drying the coating film to form a dried coating film, and
  a step of irradiating the dried coating film with active energy rays to form a vertically oriented liquid crystal cured film.

The coating film of the polymerizable liquid crystal composition can be formed, for example, by applying the polymerizable liquid crystal composition for forming a vertically oriented liquid crystal cured film on a base material, an orientation film, or the like. As the base material that can be used here, it is possible to use the same base materials as those exemplified above as base materials that can be used for producing the horizontally oriented liquid crystal cured film.

The orientation film can be appropriately selected from materials having a vertical orientation regulating force that orients the polymerizable liquid crystal compound in the direction perpendicular to the plane of the coating film. The orientation regulating force can be arbitrarily adjusted according to the type of orientation layer, surface conditions, rubbing conditions, etc., and when the orientation film is formed from a photo-orientational polymer, the orientation regulating force can be arbitrarily adjusted according to polarization irradiation conditions, etc. Examples of such a material include orientational polymers described above as the orientation films that can be used for producing the horizontally oriented liquid crystal cured film, such as polyimide, polyamide, and polyamic acid as a hydrolyzate thereof; fluorine-based polymers such as perfluoroalkyl; and silane compounds and polysiloxane compounds obtained by a condensation reaction thereof. The vertical orientation film can be obtained by applying a composition containing such a material and a solvent, for example, the solvent exemplified in the horizontally oriented liquid crystal cured film, to a base material, removing the solvent, and then heating a coated film, or the like.

Then, the solvent is removed by drying or the like to form a dried coating film. Examples of the drying method include a natural drying method, ventilation drying method, heat drying method, and decompression drying method. From the viewpoint of productivity, heat drying is preferred, and the heating temperature in that case is preferably equal to or higher than the phase transition temperature of the polymerizable liquid crystal compound while the solvent can be removed.

The obtained dried coating film is irradiated with active energy rays (more specifically, ultraviolet rays, etc.), and the polymerizable liquid crystal compound is polymerized while maintaining the state in which the polymerizable liquid crystal compound is oriented in the direction perpendicular to the plane of the coating film, whereby a vertically oriented liquid crystal cured film is formed. Examples of the polymerization method include the same methods that can be adopted in the method of producing a horizontally oriented liquid crystal cured film.

The laminate of the present invention preferably satisfies the formula (7).

$$\frac{nxA(450) - nyA(450)}{nxA(550) - nyA(550)} < \frac{\frac{nxA(450) + nyA(450)}{2} - nzA(450)}{\frac{nxA(550) + nyA(550)}{2} - nzA(550)} \leqq \frac{\frac{nxC(450) + nyC(450)}{2} - nzC(450)}{\frac{nxC(550) + nyC(550)}{2} - nzC(550)} \qquad (7)$$

In the formula (7), $nxC(\lambda)$ represents the main refractive index at a wavelength of $\lambda$ nm in the film surface of the vertically oriented liquid crystal cured film, $nyC(\lambda)$ represents the refractive index at a wavelength of $\lambda$ nm in the direction orthogonal to the direction of nxC in the same plane as nxC, $nzC(\lambda)$ represents the refractive index at a wavelength of $\lambda$ nm in the film thickness direction of the vertically oriented liquid crystal cured film, and $nxA(\lambda)$, $nyA(\lambda)$, and $nzA(\lambda)$ are referred to as the same meanings as in the above formulas (1) and (3).

The formula (7) means that αthA that is a ratio of the phase difference values at a wavelength of 450 nm and a wavelength of 550 nm in the film thickness direction of the horizontally oriented liquid crystal cured film is larger than αA that is the ratio of the phase difference values at a wavelength of 450 nm and a wavelength of 550 nm in the film surface of the horizontally oriented liquid crystal cured film and means that a ratio (hereinafter, also referred to as "αthC") of the phase difference values at a wavelength of 450 nm and a wavelength of 550 nm in the film thickness direction of the vertically oriented liquid crystal cured film is αthA or more. That is, when αA<αthA≦αthC is satisfied, and thereby an elliptical polarizing plate to which a laminate in which a horizontally oriented liquid crystal cured film and a vertically oriented liquid crystal cured film are combined is applied to a display device, the effect of improving the front reflection hue and suppressing a change in oblique reflection hue can be obtained.

In the laminate of the present invention, the horizontally oriented liquid crystal cured film and the vertically oriented liquid crystal cured film can be laminated via, for example, a pressure-sensitive adhesive layer or an adhesive layer. As the pressure-sensitive adhesive and the adhesive, those conventionally known in the art can be used. The other polymerizable liquid crystal composition for forming a liquid crystal cured film may be directly applied onto the previously produced horizontally oriented liquid crystal cured film or vertically oriented liquid crystal cured film, if necessary, via the orientation film. Alternatively, a polymerizable liquid crystal composition for forming a liquid crystal cured film may be applied onto another layer constituting the laminate of the present invention.

As described above, the horizontally oriented liquid crystal cured film satisfies the formula (1):

$$nxA(450) > nyA(450) > nzA(450) \qquad (1)$$

[in the formula (1), nxA(450) represents a main refractive index at a wavelength $\lambda$ of 450 nm in a film surface of the horizontally oriented liquid crystal cured film, nyA(450) represents a refractive index at a wavelength $\lambda$ of 450 nm in a direction orthogonal to a direction of nxA in the same plane as nxA, and nzA(450) represents a refractive index at a wavelength $\lambda$ of 450 nm in a film thickness direction of the horizontally oriented liquid crystal cured film], and a formula (2):

$$ReA(450)/ReA(550) < 1.00 \qquad (2)$$

[in the formula (2), $ReA(\lambda)$ represents the in-plane phase difference value of the horizontally oriented liquid crystal cured film at a wavelength of $\lambda$ nm, and $ReA(\lambda)=(nxA(\lambda)-nyA(\lambda))\times dA$ (dA represents the film thickness of the horizontally oriented liquid crystal cured film)].

The horizontally oriented liquid crystal cured film satisfying the formulas (1) and (2) is excellent in the front reflection hue and the oblique reflection hue in the display device to which the elliptical polarizing plate including this horizontally oriented liquid crystal cured film is applied. In particular, when the horizontally oriented liquid crystal cured film is combined with the vertically oriented liquid crystal cured film that has been widely used in general, the horizontally oriented liquid crystal cured film is excellent in the effect of suppressing the tint change (for example, a problem that coloring such as red or blue is confirmed in the oblique reflection hue of a display) in the oblique reflection hue that occurs due to a difference between the wavelength dispersibility of the horizontally oriented liquid crystal cured film and the wavelength dispersibility of the vertically oriented liquid crystal cured film. Therefore, the present invention is a cured material of a polymerizable liquid crystal composition containing at least one type of polymerizable liquid crystal compound, is a horizontally oriented liquid crystal cured film that is a cured material of a polymerizable liquid crystal composition cured in a state in which the polymerizable liquid crystal compound is horizontally oriented with respect to the plane of the liquid crystal cured film, and also relates to the horizontally oriented liquid crystal cured film satisfying the above formulas (1) and (2).

The horizontally oriented liquid crystal cured film of the present invention preferably satisfies the optical characteristics of the horizontally oriented liquid crystal cured film constituting the laminate of the present invention, for example, the optical characteristics represented by the above formulas (3) to (6). Examples of the polymerizable liquid crystal compound constituting the horizontally oriented liquid crystal cured film of the present invention, various components contained in the polymerizable liquid crystal composition, and the like include the same constituents as those exemplified above as constituents of the horizontally oriented liquid crystal cured film constituting the laminate of the present invention. The horizontally oriented liquid crystal cured film of the present invention can be produced by the same method as described as the method of producing the horizontally oriented liquid crystal cured film constituting the laminate of the present invention.

The present invention includes an elliptical polarizing plate including the laminate of the present invention and a polarizing film.

The polarizing film is a film having a polarizing function, and examples thereof include a drawn film on which a pigment having absorption anisotropy is adsorbed, and a film including, as a polarizer, a film coated with a pigment having absorption anisotropy. Examples of the pigment having absorption anisotropy include dichroic pigments.

The film containing as a polarizer a drawn film on which a pigment having absorption anisotropy is adsorbed is fabricated usually by sandwiching with a transparent protective film via an adhesive to at least one surface of a polarizer produced via a step of uniaxially drawing a polyvinyl alcohol resin film, a step of dyeing the polyvinyl alcohol resin film with a dichroic pigment to allow the dichroic pigment to be adsorbed, a step of treating the dichroic pigment-adsorbed polyvinyl alcohol resin film with a boric acid aqueous solution, and a step of performing washing with water after treatment with a boric acid aqueous solution.

The polyvinyl alcohol resin is obtained by saponifying a polyvinyl acetate resin. As the polyvinyl acetate resin, copolymers of vinyl acetate and other monomers copolymerizable with vinyl acetate are used, in addition to polyvinyl acetate as a homopolymer of vinyl acetate. Examples of the other monomers copolymerizable with vinyl acetate include unsaturated carboxylic acids, olefins, vinyl ethers, unsaturated sulfonic acids, and acrylamides having an ammonium group.

The degree of saponification of the polyvinyl alcohol resin is usually about 85 to 100 mol %, and preferably 98 mol % or more. The polyvinyl alcohol resin may be modified, and for example, polyvinylformal and polyvinylacetal modified with aldehydes can also be used. The degree of polymerization of the polyvinyl alcohol resin is usually about 1,000 to 10,000, and preferably in a range of 1,500 to 5,000.

A film formed of such a polyvinyl alcohol resin is used as an original film of a polarizing film. The method of forming a film of a polyvinyl alcohol resin is not particularly restricted, and its film formation can be conducted by known methods. The thickness of a polyvinyl alcohol original film can be, for example, about 10 to 150 μm.

Uniaxial drawing of a polyvinyl alcohol resin film can be conducted before dyeing with a dichroic pigment, simultaneously with dyeing or after dyeing. When uniaxial drawing is conducted after dyeing, this uniaxial drawing may be conducted before a boric acid treatment or conducted during a boric acid treatment. Further, it is also possible to perform uniaxial drawing in these several stages. In uniaxial drawing, drawing may be conducted uniaxially between rolls having different circumferential velocities, or drawing may be conducted uniaxially using a hot roll. Uniaxial drawing may be dry drawing in which drawing is conducted in atmospheric air or may be wet drawing in which a solvent is used and a polyvinyl alcohol resin film is swollen and drawn under the swollen condition. The draw ratio is usually about 3 to 8 times.

Dyeing of a polyvinyl alcohol resin film with a dichroic pigment is carried out, for example, by a method of immersing a polyvinyl alcohol resin film in an aqueous solution containing a dichroic pigment.

As a dichroic pigment, specifically, iodine and dichroic organic dyes are used. The dichroic organic dye includes dichroic direct dyes composed of a disazo compound such as C.I. DIRECT RED 39 and the like and dichroic direct dyes composed of a compound such as trisazo, tetrakisazo and the like. It is preferred that a polyvinyl alcohol resin film is subjected previously to a treatment of immersing into water before the dyeing treatment.

When iodine is used as the dichroic pigment, a method of immersing a polyvinyl alcohol resin film in an aqueous solution containing iodine and potassium iodide to dye the film is usually adopted.

The content of iodine in this aqueous solution is usually about 0.01 to 1 part by mass per 100 parts by mass of water. The content of potassium iodide is usually about 0.5 to 20 parts by mass per 100 parts by mass of water. The temperature of an aqueous solution used for dyeing is usually about 20 to 40° C. The time of immersion into this aqueous solution (dyeing time) is usually about 20 to 1,800 seconds.

In contrast, when a dichroic organic dye is used as the dichroic pigment, a method of immersing a polyvinyl alcohol resin film in an aqueous solution containing a water-soluble dichroic dye to dye the film is usually adopted.

The content of a dichroic organic dye in this aqueous solution is usually about $1 \times 10^{-4}$ to 10 parts by mass, preferably $1 \times 10^{-3}$ to 1 part by mass, further preferably $1 \times 10^{-3}$ to $1 \times 10^{-2}$ parts by mass per 100 parts by mass of water. This aqueous solution may also contain an inorganic salt such as sodium sulfate as a dyeing aid. The temperature of a dichroic dye aqueous solution used for dyeing is usually about 20 to 80° C. The time of immersion into this aqueous solution (dyeing time) is usually about 10 to 1,800 seconds.

The boric acid treatment after dyeing with a dichroic pigment can be conducted usually by a method of immersing the dyed polyvinyl alcohol resin film in a boric acid aqueous solution. The content of boric acid in this boric acid aqueous solution is usually about 2 to 15 parts by mass, preferably 5 to 12 parts by mass per 100 parts by mass of water. When iodine is used as the dichroic pigment, it is preferred that this boric acid aqueous solution contains potassium iodide, and in this case, the content of potassium iodide is usually about 0.1 to 15 parts by mass, preferably 5 to 12 parts by mass per 100 parts by mass of water. The time of immersing into a boric acid aqueous solution is usually about 60 to 1,200 seconds, preferably 150 to 600 seconds, and further preferably 200 to 400 seconds. The temperature of the boric acid treatment is usually 50° C. or higher, preferably 50 to 85° C., and further preferably 60 to 80° C.

The polyvinyl alcohol resin film after the boric acid treatment is usually treated by washing with water. The water-washing treatment can be conducted, for example, by a method of immersing the polyvinyl alcohol resin film treated with boric acid in water. The temperature of water in the water-washing treatment is usually about 5 to 40° C.

The immersing time is usually about 1 to 120 seconds.

After washing with water, a drying treatment is performed to obtain a polarizer. The drying treatment can be conducted by using, for example, a hot air drier and a far infrared heater. The temperature of the drying treatment is usually about 30 to 100° C., and preferably 50 to 80° C. The time of the drying treatment is usually about 60 to 600 seconds, and preferably 120 to 600 seconds. By the drying treatment, the moisture percentage of a polarizer is lowered to about practical level. Its moisture percentage is usually about 5 to 20% by weight, and preferably 8 to 15% by weight. When the moisture percentage is lower than 5% by weight, flexibility of a polarizer is lost, and a polarizer is damaged or broken after drying in some cases. When the moisture percentage is over 20% by weight, there is a possibility of deterioration of thermal stability of a polarizer.

The thickness of a polarizer obtained by thus subjecting a polyvinyl alcohol resin film to uniaxial drawing, dyeing with a dichroic pigment, a boric acid treatment, washing with water and drying is preferably 5 to 40 μm.

The film coated with a pigment having absorption anisotropy includes films obtained by coating a composition containing a dichroic pigment having liquid crystallinity or a composition containing a dichroic pigment and a polymerizable liquid crystal, and the like. This film preferably has a protective film on one surface or both surfaces thereof. Examples the protective film include the same resin films as those exemplified above as base materials that can be used for producing the horizontally oriented liquid crystal cured film.

With respect to the film coated with a pigment having absorption anisotropy, the smaller thickness is more preferred; however, when too thin, there is a tendency of lowering of strength, leading to poor workability. The thickness of this film is usually 20 μm or less, preferably 5 μm or less, and more preferably 0.5 to 3 μm.

Specific examples of the film coated with a pigment having absorption anisotropy include films described in JP-A-2012-33249 and the like.

A polarizing film is obtained by laminating a transparent protective film on at least one surface of thus obtained polarizer via an adhesive. As the transparent protective film, it is possible to preferably use the same transparent films as the resin films exemplified above as base materials that can be used for producing the horizontally oriented liquid crystal cured film.

The elliptical polarizing plate according to the present invention is formed to include the laminate of the present invention and the polarizing film. For example, by laminating the laminate of the present invention and the polarizing film via an adhesive layer or the like, the elliptical polarizing plate of the present invention can be obtained.

In one embodiment of the present invention, when the laminate of the present invention and the polarizing film are laminated, it is preferred to laminate the laminate and the polarizing film so that an angle between a slow axis (optical axis) of the horizontally oriented liquid crystal cured film constituting the laminate and an absorption axis of the polarizing film is 45±5°.

The elliptical polarizing plate according to the present invention may have a configuration as provided by a conventional general elliptical polarizing plate, or a polarizing film and a phase difference film. Examples of such a configuration include a pressure-sensitive adhesive layer (sheet) for attaching the elliptical polarizing plate to a display element such as an organic EL and a protective film used for the purpose of protecting the surfaces of the polarizing film and the phase difference film from scratches and stains.

The elliptical polarizing plate according to the present invention can be used in various display devices.

The display device means a device having a display element, and includes a light emitting element or a light emitting device as a light emitting source. Examples of the display device include a liquid crystal display device, organic electroluminescence (EL) display device, inorganic electroluminescence (EL) display device, touch panel display device, electron emission display device (for example, electric field emission display device (FED), surface electric field emission display device (SED), electronic paper (display device using electronic ink or electrophoretic element), plasma display device, projection type display device (for example, grating light valve (GLV) display device, display device with digital micromirror device (DMD)), piezoelectric ceramic display, etc. The liquid crystal display device may be a transmissive liquid crystal display, a semi-transmissive liquid crystal display, a reflective liquid crystal display, a direct viewing liquid crystal display or a projection liquid crystal display. These display devices may also be display devices displaying a two-dimensional image or stereoscopic display devices displaying a three-dimensional image. Particularly, the elliptical polarizing plate according to the present invention can be suitably used for an organic electroluminescent (EL) display device and an inorganic electroluminescent (EL) display device, and the laminate of the present invention can be suitably used for the liquid crystal display device and the touch panel display device. These display devices are provided with the elliptical polarizing plate according to the present invention excellent in front reflection hue and oblique reflection hue at wavelengths in the entire visible light range, whereby good image display characteristics can be exhibited.

EXAMPLES

Hereinafter, the present invention will be described more specifically by examples. "%" and "part(s)" in the examples refer to % by mass and part(s) by mass, respectively, unless otherwise described.

1. Example 1

(1) Preparation of Composition for Forming Horizontal Orientation Film

Five parts (weight average molecular weight: 30000) of a photo-orientational material having the following structure and 95 parts of cyclopentanone (solvent) were mixed as components, and the resulting mixture was stirred at 80° C. for 1 hour to obtain a composition for forming a horizontal orientation film.

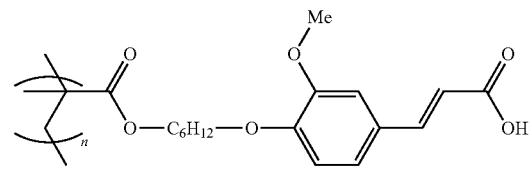

(2) Preparation of Polymerizable Liquid Crystal Compound

A polymerizable liquid crystal compound (X1) and a polymerizable liquid crystal compound (X2) having the following molecular structures were prepared for use in forming a horizontally oriented liquid crystal cured film. The polymerizable liquid crystal compound (X1) was produced according to the method described in JP-A-2010-31223. The polymerizable liquid crystal compound (X2) was produced according to the method described in JP-A-2009-173893.

Polymerizable Liquid Crystal Compound (X1)

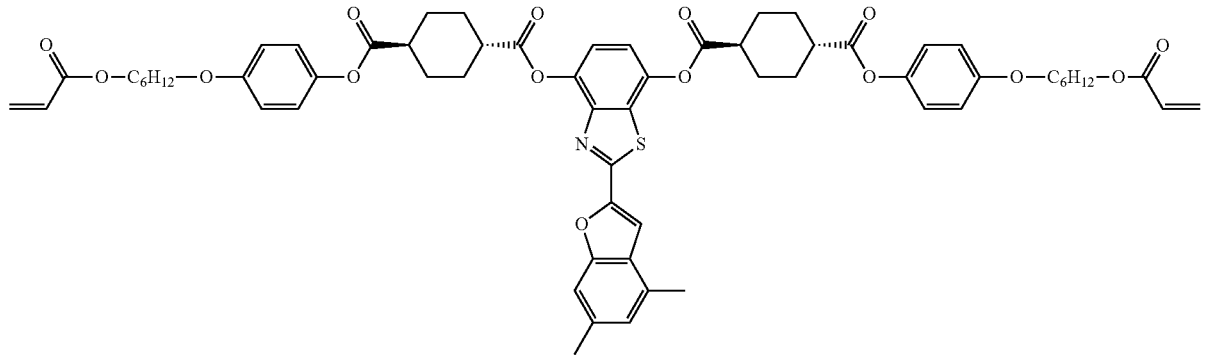

Polymerizable Liquid Crystal Compound (X2)

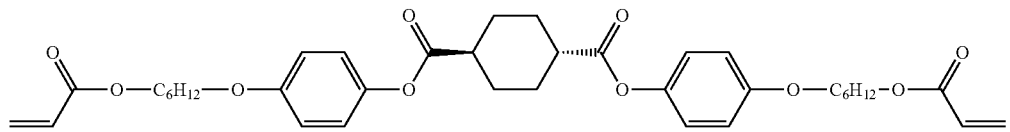

(3) Preparation of Polymerizable Liquid Crystal Composition for Forming Horizontally Oriented Liquid Crystal Cured Film The polymerizable liquid crystal compound (X1) and the polymerizable liquid crystal compound (X2) were mixed at a mass ratio of 90:10 to obtain a mixture. To 100 parts by mass of the obtained mixture, 0.1 parts by mass of a leveling agent "BYK-361N" (manufactured by BM Chemie GmbH) and 6 parts by mass of 2-dimethylamino-2-benzyl-1-(4-morpholinophenyl)butane-1-one ("Irgacure (registered trademark) 369 (Irg369)" manufactured by BASF Japan Ltd.) as a photopolymerization initiator were added. In addition, N-methyl-2-pyrrolidone (NMP) was added so that the solid content concentration became 13%. By stirring this mixture at 80° C. for 1 hour, a polymerizable liquid crystal composition for forming a horizontally oriented liquid crystal cured film was obtained. The nematic phase transition temperature (the phase transition temperature was measured as a mixture at a mass ratio of the polymerizable liquid crystal compounds (X1) and (A2) of 90:10) of the polymerizable liquid crystal compound in the polymerizable liquid crystal composition for forming a horizontally oriented liquid crystal cured film was 110° C.

A 1 mg/50 mL tetrahydrofuran solution of the polymerizable liquid crystal compound (X1) was prepared, and a measurement sample was placed in a measurement cell with an optical path length of 1 cm and set to an ultraviolet-visible spectrophotometer ("UV-2450" manufactured by Shimadzu Corporation) to measure an absorption spectrum. As a result of reading the wavelength, which became the maximum absorption wavelength, from the obtained absorption spectrum, a maximum absorption wavelength $\lambda_{max}$ in a wavelength range of 300 to 400 nm was 350 nm.

(4) Preparation of Horizontally Oriented Liquid Crystal Cured Film

A composition for forming a horizontal orientation film was applied onto a COP film (ZF-14-50) manufactured by Zeon Corporation with a bar coater, and dried at 80° C. for 1 minute. Using a polarized UV irradiation device (SPOT CURE SP-9; manufactured by Ushio Inc.), polarized UV exposure was performed at an accumulated light quantity of 100 mJ/cm² at a wavelength of 313 nm to obtain a horizontal orientation film. The film thickness of the obtained horizontal orientation film was measured with an ellipsometer and found to be 100 nm. In addition, a COP surface of a laminate of the obtained horizontal orientation film and the COP and a glass plate having a length of 5 cm, a width of 5 cm, and a thickness of 0.7 μm were stuck together via a pressure-sensitive sticky agent having a thickness of 15 μm, manufactured by Lintec Corporation.

Subsequently, the polymerizable liquid crystal composition for forming a horizontally oriented liquid crystal cured film was applied onto the horizontal orientation film using a spin coater. The horizontal orientation film was placed on a hot plate heated to 120° C. with the glass surface facing down, and heated for 60 seconds to dry the coating film. At this time, in order to prevent the solvent, volatilizing from the coating film, from evaporating to the outside, the sample was placed on the hot plate, and, at the same time, the entire sample was covered with a glass petri dish. As a result of calculating a volatile solvent concentration in the drying step from a Wet film thickness of the applied polymerizable liquid crystal composition for forming a horizontally oriented liquid crystal cured film, the sample size, and the diameter and depth of the petri dish placed on the sample, the volatile solvent concentration was 0.292 mg/cm³. After that, the sample was temporarily placed on a metal laboratory table at room temperature (20° C.), and the sample temperature was lowered to around room temperature. Then, using a high pressure mercury lamp (Unicure VB-15201BY-A, manufactured by Ushio Inc.), the surface coated with the polymerizable liquid crystal composition for forming a horizontally oriented liquid crystal cured film was irradiated with ultraviolet rays (in a nitrogen atmosphere, the accumulated light quantity at a wavelength of 365 nm: 500 mJ/cm²) to form a horizontally oriented liquid crystal cured film. Then, a laminate of COP/horizontal orientation film/horizontally oriented liquid crystal cured film was peeled off from the pressure-sensitive adhesive and used for various physical property measurements and sample preparation described later.

(5) Preparation of Composition for Forming Vertical Orientation Film

Polyimide ("Sunever SE-610" manufactured by Nissan Chemical Corporation) (0.5 parts by mass), 72.3 parts by mass of N-methyl-2-pyrrolidone, 18.1 parts by mass of 2-butoxyethanol, 9.1 parts by mass of ethylcyclohexane, and 0.01 parts by mass of DPHA (manufactured by Shin-Nakamura Chemical Co, Ltd.) were mixed to prepare a composition for forming a vertical orientation film.

(6) Preparation of Polymerizable Liquid Crystal Composition for Forming Vertically Oriented Liquid Crystal Cured Film To a liquid crystal compound LC242: Paliocolor LC242 (registered trademark of BASF) represented by the following formula (LC242), 0.1 parts by mass of a leveling agent ("F-556" manufactured by DIC Corporation), and 3 parts by mass of the polymerization initiator Irg369 were added. Cyclopentanone was added so that the solid content concentration was 13 parts by mass, and these were mixed to obtain a polymerizable liquid crystal composition for forming a vertically oriented liquid crystal cured film.

Liquid Crystal Compound LC242: Paliocolor LC242 (Registered Trademark of BASF)

film having undergone the boric acid treatment step was washed with pure water of 8° C., then dried at 65° C., to obtain a polarizer (thickness after drawing, 27 μm) in which iodine was adsorbed and oriented in the polyvinyl alcohol. At this time, in the iodine dyeing step and the boric acid treatment step, drawing was conducted. The total draw ratio in such drawing operations was 5.3 times. The resultant polarizer and the saponified triacetylcellulose film (manufactured by Konica Minolta Inc. KC4UYTAC 40 μm) were stuck together via an aqueous adhesive by nip rolls. The resultant laminate material was dried at 60° C. for 2 minutes while keeping the tension thereof at 430 N/m, to obtain a polarizing film having the triacetylcellulose film as a protective film on one surface. The above-described aqueous adhesive was prepared by adding 3 parts by mass of a carboxyl group-modified polyvinyl alcohol (manufactured by Kuraray Co., Ltd., Kuraray POVAL KL318) and 1.5 parts by mass of a water-soluble polyamide epoxy resin (manufactured by Sumika Chemtex Co., Ltd., Sumirez Resin 650, aqueous solution having a solid content concentration of 30%] to 100 parts by mass of water.

The optical characteristics of the obtained polarizing film were measured. The measurement was carried out with a

LC242

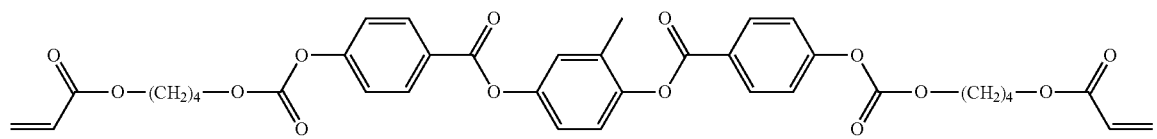

(7) Preparation of Vertically Oriented Liquid Crystal Cured Film

Corona treatment was performed on a COP film (Zeon Corporation "ZF-14-23") as a base material. A polymerizable liquid crystal composition for forming a vertical orientation film was applied to the COP film that had been subjected to the corona treatment, using a bar coater to form a coating film. The coating film was dried at 80° C. for 1 minute to obtain a vertical orientation film. The film thickness of the obtained vertical orientation film was measured with an ellipsometer and found to be 0.2 μm. Subsequently, the polymerizable liquid crystal composition for forming a vertically oriented liquid crystal cured film was applied onto the prepared vertical orientation film to form a coating film. After the coating film was dried at 80° C. for 1 minute, using a high pressure mercury lamp ("Unicure VB-15201BY-A" manufactured by Ushio Inc.), the dried coating film was irradiated with ultraviolet rays in a nitrogen atmosphere under conditions where the accumulated light quantity at a wavelength of 365 nm was 500 mJ/cm$^2$ to form a vertically oriented liquid crystal cured film.

(8) Fabrication of Polarizing Film

A polyvinyl alcohol film having an average degree of polymerization of about 2,400, a saponification degree of 99.9 mol % or more, and a thickness of 75 μm was immersed in pure water at 30° C. and then immersed at 30° C. in an aqueous solution in which a weight ratio of iodine/potassium iodide/water was 0.02/2/100 to perform dyeing with iodine (iodine dyeing step). The polyvinyl alcohol film having undergone the iodine dyeing step was immersed at 56.5° C. in an aqueous solution in which a weight ratio of potassium iodide/boric acid/water was 12/5/100 to perform boric acid treatment (boric acid treatment step). The polyvinyl alcohol spectrophotometer (V7100, manufactured by JASCO Corporation) using a polarizer surface of the polarizing film obtained above as an incident surface.

A visibility correction single transmittance obtained was 42.1%, a visibility correction polarization degree was 99.996%, a single hue a was −1.1, and a single hue b was 3.7.

<Calculation of Three-Dimensional Refractive Index and Phase Difference Value of Horizontally Oriented Liquid Crystal Cured Film and Vertically Oriented Liquid Cured Film>

The COP that was a base material was an optically isotropic film with a phase difference value of 1 nm or less at a wavelength of 550 nm, and after confirming that measured values of a sample for measuring optical characteristics were not affected, using a measuring machine ("KOBRA-WPR" manufactured by Oji Scientific Instruments), an angle of incidence of light on the measurement sample was changed to measure a front phase difference value of the horizontally oriented liquid crystal cured film and the vertically oriented liquid crystal cured film, and a phase difference value at 40° tilt around a phase advance axis. An average refractive index at each wavelength was measured using an ellipsometer M-220 manufactured by JASCO Corporation. The film thickness was measured using an Optical NanoGauge film thickness meter C12562-01 manufactured by Hamamatsu Photonics K.K.

From the above-mentioned front phase difference value, phase difference value at 40° tilt around the phase advance axis, average refractive index, and film thickness value, the three-dimensional refractive index was calculated with reference to a technical document from Oji Scientific Instruments (http://www.oji-keisoku.co.jp/products/kobra/reference.html). From the obtained three-dimensional refractive index, the optical characteristics of each of the horizontally oriented liquid crystal cured film and the vertically oriented liquid crystal cured film were calculated according to the following formulas. Results are shown in Table 1.

$$ReA(\lambda)=(nxA(\lambda)-nyA(\lambda))\times dA$$

$$RthA(\lambda)=((nxA(\lambda)+nyA(\lambda))/2-nzA(\lambda))\times dA$$

$$\alpha A = ReA(450)/ReA(550)$$

$$\alpha thA = RthA(450)/RthA(550)$$

$$RthC(A)=((nxC(\lambda)+nyC(\lambda))/2-nzC(\lambda))\times dC$$

$$\alpha thC = RthC(450)/RthC(550)$$

In the above formulas, nxA(λ) represents the in-plane main refractive index of the horizontally oriented liquid crystal cured film at a wavelength of λ nm, nyA(λ) represents a refractive index in a direction orthogonal to nxA(λ) in a plane, and nzA(λ) represents a refractive index in a thickness direction of the horizontally oriented liquid crystal cured film at a wavelength of λ nm. ReA(λ) represents the in-plane phase difference value of the horizontally oriented liquid crystal cured film at a wavelength of λ nm, RthA(λ) represents a phase difference value in the film thickness direction of the horizontally oriented liquid crystal cured film at a wavelength of λ nm, αA represents a ratio of ReA(450) and ReA(550) of the horizontally oriented liquid crystal curing, αthA represents a ratio of RthA(450) and RthC(550) of the horizontally oriented liquid crystal curing, and dA represents the film thickness of the horizontally oriented liquid crystal cured film.

nxC(λ) represents the in-plane main refractive index of the vertically oriented liquid crystal cured film at a wavelength of λ nm, nyC(λ) represents a refractive index in a direction orthogonal to nxC(λ) in a plane, and nzC(λ) represents a refractive index in a thickness direction of the vertically oriented liquid crystal cured film at a wavelength of λ nm. When nxC(λ)=nyC(λ), nxC(λ) may represent a refractive index in any direction in a film surface. ReC(λ) represents the in-plane phase difference value of the vertically oriented liquid crystal cured film at a wavelength of λ nm, RthC(λ) represents a phase difference value in the film thickness direction of the vertically oriented liquid crystal cured film at a wavelength of λ nm, αthC represents a ratio of RthC(450) and RthC(550) of the vertically oriented liquid crystal curing, and dC represents the film thickness of the vertically oriented liquid crystal cured film.

(9) Production of Laminate of Horizontally Oriented Liquid Crystal Cured Film and Vertically Oriented Liquid Crystal Cured Film, and Elliptical Polarizing Plate First, corona treatment was performed on coated surfaces of the horizontally oriented liquid crystal cured film and the vertically oriented liquid crystal cured film. After that, the respective coated surface sides were stuck together via a pressure-sensitive adhesive (manufactured by Lintec Corporation, pressure-sensitive sticky agent: 15 μm) to prepare a laminate of the horizontally oriented liquid crystal cured film and the vertically oriented liquid crystal cured film. After that, the base material on the side of the horizontally oriented liquid crystal cured film was peeled off and stuck to the polarizing film produced by the above method via a pressure-sensitive adhesive (manufactured by Lintec Corporation, pressure-sensitive sticky agent: 15 μm) to produce an elliptical polarizing plate.

<Confirmation of Front Reflection Hue and Oblique Reflection Hue>

The elliptical polarizing plate produced by the above method was stuck to a plane mirror via a pressure-sensitive adhesive (manufactured by Lintec Corporation, pressure-sensitive sticky agent: 15 μm), the reflection hue was confirmed, and evaluation was performed according to the following criteria. Results are shown in Table 1. The front reflection hue is the hue obtained by visually observing the sample at 50 cm away from the front to confirm the hue, and the oblique reflection hue is the hue obtained by visually observing the sample at 50 cm away from a direction in which an elevation angle is 60° and an azimuth angle is 0 to 360°.

⊙: Under the condition of arranging the sample and glossy black drawing paper directly 1 m below a 40 W 3-wavelength lamp, the hue is confirmed with naked eyes, and no hue is felt.

○: Under the condition of arranging the sample and glossy black drawing paper directly 1 m below a 40 W 3-wavelength lamp, when hue is confirmed with naked eyes, slight hue is felt, and the hue varies depending on the azimuth angle and looks reddish black or bluish black. In addition, when the sample alone is confirmed with naked eyes directly 1.5 m below a 40 W 3-wavelength lamp, no hue is felt at any azimuth angle.

Δ: When the sample alone is confirmed with naked eyes directly 1.5 m below a 40 W 3-wavelength lamp, hue is felt, and the hue varies depending on the azimuth angle and looks bluish black or reddish black.

2. Example 2

A sample was prepared and evaluated in the same manner as in Example 1 except that in the method of preparing the horizontally oriented liquid crystal cured film, the volatile solvent concentration in the drying step was changed to 0.011 mg/cm³ by changing the depth of the petri dish. Results are shown in Table 1.

3. Example 3

A sample was prepared and evaluated in the same manner as in Example 1 except that the horizontally oriented liquid crystal cured film was prepared according to the following method. Results are shown in Table 1.

Method of Preparing Horizontally Oriented Liquid Crystal Cured Film of Example 3

A composition for forming a horizontal orientation film was applied on a COP film (ZF-14-50) manufactured by Zeon Corporation with a bar coater, and dried at 80° C. for 1 minute. Using a polarized UV irradiation device (SPOT CURE SP-9; manufactured by Ushio Inc.), polarized UV exposure was performed at an accumulated light quantity of 100 mJ/cm² at a wavelength of 313 nm to obtain a horizontal orientation film. The film thickness of the obtained horizontal orientation film was measured with an ellipsometer and found to be 100 nm. In addition, a COP surface of a laminate of the obtained horizontal orientation film and the COP and a glass plate having a length of 5 cm, a width of 5 cm, and a thickness of 0.7 μm were stuck together via a pressure-sensitive sticky agent having a thickness of 15 μm, manufactured by Lintec Corporation.

Subsequently, the polymerizable liquid crystal composition for forming a horizontally oriented liquid crystal cured film was applied onto the horizontal orientation film using a spin coater. The horizontal orientation film was placed on a hot plate heated to 120° C. with the glass surface facing down, and heated for 60 seconds. Subsequently, the horizontal orientation film was placed on the hot plate heated to 60° C. with the glass surface facing down, and heated for 30 seconds (slow cooling step). After that, the sample was temporarily placed on a metal laboratory table at room temperature (20° C.), and the sample temperature was lowered to around room temperature. Then, using a high pressure mercury lamp (Unicure VB-15201BY-A, manufactured by Ushio Inc.), the surface coated with the polymerizable liquid crystal composition for forming a horizontally oriented liquid crystal cured film was irradiated with ultraviolet rays (in a nitrogen atmosphere, the accumulated light quantity at a wavelength of 365 nm: 500 mJ/cm$^2$) to form a horizontally oriented liquid crystal cured film. Then, a laminate of COP/horizontal orientation film/horizontally oriented liquid crystal cured film was peeled off from the pressure-sensitive adhesive and used for various physical property measurements and sample preparation.

4. Example 4

A sample was prepared and evaluated in the same manner as in Example 1 except that the horizontally oriented liquid crystal cured film was prepared according to the following method. Results are shown in Table 1.

Method of Preparing Horizontally Oriented Liquid Crystal Cured Film of Example 4

A composition for forming a horizontal orientation film was applied on a COP film (ZF-14-50) manufactured by Zeon Corporation with a bar coater, and dried at 80° C. for 1 minute. Using a polarized UV irradiation device (SPOT CURE SP-9; manufactured by Ushio Inc.), polarized UV exposure was performed at an accumulated light quantity of 100 mJ/cm$^2$ at a wavelength of 313 nm to obtain a horizontal orientation film. The film thickness of the obtained horizontal orientation film was measured with an ellipsometer and found to be 100 nm. In addition, a COP surface of a laminate of the obtained horizontal orientation film and the COP and a glass plate having a length of 5 cm, a width of 5 cm, and a thickness of 0.7 μm were stuck together via a pressure-sensitive sticky agent having a thickness of 15 μm, manufactured by Lintec Corporation.

Subsequently, the polymerizable liquid crystal composition for forming a horizontally oriented liquid crystal cured film was applied onto the horizontal orientation film using a spin coater. The horizontal orientation film was placed on a hot plate heated to 120° C. with the glass surface facing down, and heated for 60 seconds. Subsequently, the horizontal orientation film was placed on the hot plate heated to 100° C. with the glass surface facing down, and heated for 30 seconds (slow cooling step). After that, the sample was temporarily placed on a metal laboratory table at room temperature, and the sample temperature was lowered to around room temperature. Then, using a high pressure mercury lamp (Unicure VB-15201BY-A, manufactured by Ushio Inc.), the surface coated with the polymerizable liquid crystal composition for forming a horizontally oriented liquid crystal cured film was irradiated with ultraviolet rays (in a nitrogen atmosphere, the accumulated light quantity at a wavelength of 365 nm: 500 mJ/cm$^2$) to form a horizontally oriented liquid crystal cured film. Then, a laminate of COP/horizontal orientation film/horizontally oriented liquid crystal cured film was peeled off from the pressure-sensitive adhesive and used for various physical property measurements and sample preparation.

5. Example 5

A sample was prepared and evaluated in the same manner as in Example 1 except that the polymerizable liquid crystal composition for forming a horizontally oriented liquid crystal cured film was prepared according to the following method. Results are shown in Table 1.

Preparation of polymerizable liquid crystal composition for forming horizontally oriented liquid crystal cured film of Example 5

A polymerizable liquid crystal compound (X3) and the polymerizable liquid crystal compound (X1) prepared with reference to JP-A-2011-207765 were mixed at a mass ratio of 90:10 to obtain a mixture. To 100 parts by mass of the obtained mixture, 0.1 parts by mass of a leveling agent "BYK-361N" and 6 parts by mass of 2-dimethylamino-2-benzyl-1-(4-morpholinophenyl)butane-1-one ("Irgacure (registered trademark) 369 (Irg369)" manufactured by BASF Japan Ltd.) as a photopolymerization initiator were added. In addition, N-methyl-2-pyrrolidone (NMP) was added so that the solid content concentration became 13%. By stirring at 80° C. for 1 hour, a polymerizable liquid crystal composition for forming a horizontally oriented liquid crystal cured film was obtained. The nematic phase transition temperature of the polymerizable liquid crystal compound in the polymerizable liquid crystal composition for forming a horizontally oriented liquid crystal cured film was 115° C.

A 1 mg/50 mL tetrahydrofuran solution of the polymerizable liquid crystal compound (X3) was prepared, and a measurement sample was placed in a measurement cell with an optical path length of 1 cm and set to an ultraviolet-visible spectrophotometer ("UV-2450" manufactured by Shimadzu Corporation) to measure an absorption spectrum. As a result of reading the wavelength, which became the maximum absorption wavelength, from the obtained absorption spectrum, the maximum absorption wavelength $\lambda_{max}$ in a wavelength range of 300 to 400 nm was 354 nm.

Polymerizable Liquid Crystal Compound (X3)

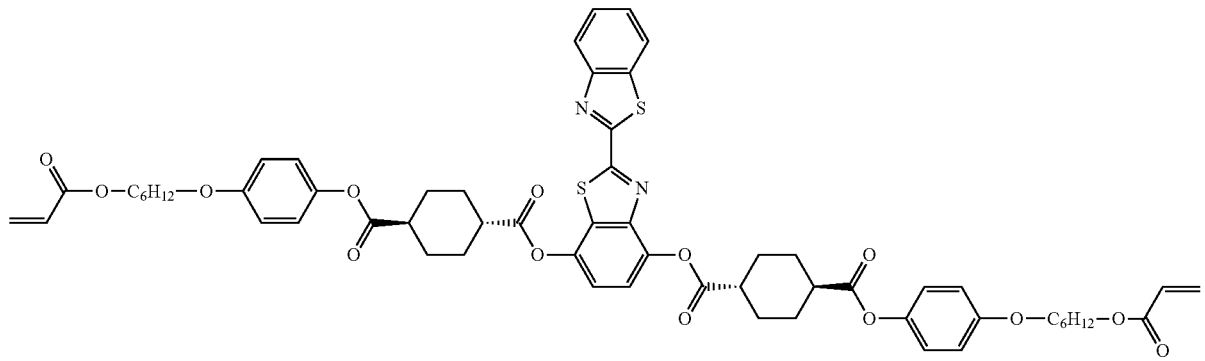

6. Example 6

A sample was prepared and evaluated in the same manner as in Example 4 except that the polymerizable liquid crystal composition for forming a horizontally oriented liquid crystal cured film was prepared according to the following method. Results are shown in Table 1.

Preparation of Polymerizable Liquid Crystal Composition for Forming Horizontally Oriented Liquid Crystal Cured Film of Example 6

The polymerizable liquid crystal compound (X3) and the liquid crystal compound (X1) prepared with reference to JP-A-2011-207765 were mixed at a mass ratio of 90:10 to obtain a mixture. To 100 parts by mass of the obtained mixture, 0.1 parts by mass of a leveling agent "BYK-361N" and 6 parts by mass of 2-dimethylamino-2-benzyl-1-(4-morpholinophenyl)butane-1-one ("Irgacure (registered trademark) 369 (Irg369)" manufactured by BASF Japan Ltd.) as a photopolymerization initiator were added. In addition, N-methyl-2-pyrrolidone (NMP) was added so that the solid content concentration became 13%. By stirring at 80° C. for 1 hour, a composition for forming a horizontally oriented liquid crystal cured film was obtained. The nematic phase transition temperature of the polymerizable liquid crystal compound in the polymerizable liquid crystal composition for forming a horizontally oriented liquid crystal cured film was 115° C.

Preparation of Polymerizable Liquid Crystal Composition for Forming Horizontally Oriented Liquid Crystal Cured Film of Example 7

A polymerizable liquid crystal compound (X4) and the polymerizable liquid crystal compound (X3) prepared with reference to JP-A-2016-81035 were mixed at a mass ratio of 15:85 to obtain a mixture. To 100 parts by mass of the obtained mixture, 0.1 parts by mass of a leveling agent "BYK-361N" and 6 parts by mass of 2-dimethylamino-2-benzyl-1-(4-morpholinophenyl)butane-1-one ("Irgacure (registered trademark) 369 (Irg369)" manufactured by BASF Japan Ltd.) as a photopolymerization initiator were added. In addition, N-methyl-2-pyrrolidone (NMP) was added so that the solid content concentration became 13%. By stirring at 80° C. for 1 hour, a polymerizable liquid crystal composition for forming a horizontally oriented liquid crystal cured film was obtained. The nematic phase transition temperature of the polymerizable liquid crystal compound in the polymerizable liquid crystal composition for forming a horizontally oriented liquid crystal cured film was 110° C.

A 1 mg/50 mL tetrahydrofuran solution of the polymerizable liquid crystal compound (X4) was prepared, and a measurement sample was placed in a measurement cell with an optical path length of 1 cm and set to an ultraviolet-visible spectrophotometer ("UV-2450" manufactured by Shimadzu Corporation) to measure an absorption spectrum. As a result of reading the wavelength, which became the maximum absorption wavelength, from the obtained absorption spectrum, the maximum absorption wavelength $\lambda_{max}$ in a wavelength range of 300 to 400 nm was 352 nm.

Polymerizable Liquid Crystal Compound (X4)

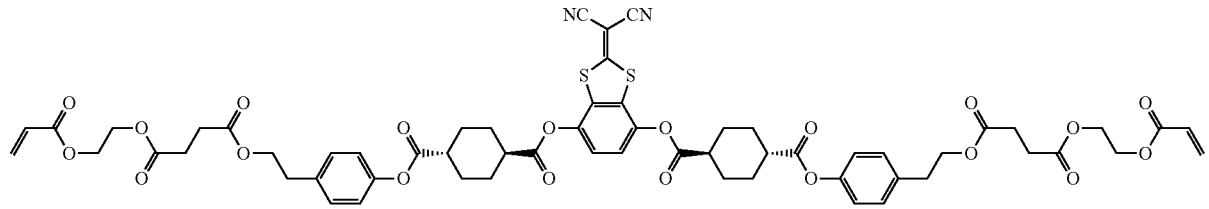 [SMILES: C=CC(=O)OCCOC(=O)CCC(=O)OCCc1ccc(OC(=O)[C@H]2CC[C@H](C(=O)Oc3ccc(OC(=O)[C@H]4CC[C@H](C(=O)Oc5ccc(CCOC(=O)CCC(=O)OCCOC(=O)C=C)cc5)CC4)c4c3SC(=C(C#N)C#N)S4)CC2)cc1]

7. Example 7

A sample was prepared and evaluated in the same manner as in Example 4 except that the polymerizable liquid crystal composition for forming a horizontally oriented liquid crystal cured film was prepared according to the following method. Results are shown in Table 1.

8. Example 8

A sample was prepared and evaluated in the same manner as in Example 4 except that the polymerizable liquid crystal composition for forming a horizontally oriented liquid crystal cured film was prepared according to the following method. Results are shown in Table 1.

Preparation of Polymerizable Liquid Crystal Composition for Forming Horizontally Oriented Liquid Crystal Cured Film of Example 8

A polymerizable liquid crystal compound (X5) and the polymerizable liquid crystal compound (X3) prepared with reference to International Patent Publication No. 2015/025793 were mixed at a mass ratio of 15:85 to obtain a mixture. To 100 parts by mass of the obtained mixture, 0.1 parts by mass of a leveling agent "BYK-361N" and 6 parts by mass of 2-dimethylamino-2-benzyl-1-(4-morpholinophenyl)butane-1-one ("Irgacure (registered trademark) 369 (Irg369)" manufactured by BASF Japan Ltd.) as a photopolymerization initiator were added. In addition, N-methyl-2-pyrrolidone (NMP) was added so that the solid content concentration became 13%. By stirring at 80° C. for 1 hour, a polymerizable liquid crystal composition for forming a horizontally oriented liquid crystal cured film was obtained. The nematic phase transition temperature of the polymerizable liquid crystal compound in the polymerizable liquid crystal composition for forming a horizontally oriented liquid crystal cured film was 105° C.

A 1 mg/50 mL tetrahydrofuran solution of the polymerizable liquid crystal compound (X5) was prepared, and a measurement sample was placed in a measurement cell with an optical path length of 1 cm and set to an ultraviolet-visible spectrophotometer ("UV-2450" manufactured by Shimadzu Corporation) to measure an absorption spectrum. As a result of reading the wavelength, which became the maximum absorption wavelength, from the obtained absorption spectrum, the maximum absorption wavelength $\lambda_{max}$ in a wavelength range of 300 to 400 nm was 352 nm.

Polymerizable Liquid Crystal Compound (X5)

Preparation of Horizontally Oriented Liquid Crystal Cured Film of Comparative Example 1

A composition for forming a horizontal orientation film was applied on a COP film (ZF-14-50) manufactured by Zeon Corporation with a bar coater, and dried at 80° C. for 1 minute. Using a polarized UV irradiation device (SPOT CURE SP-9; manufactured by Ushio Inc.), polarized UV exposure was performed at an accumulated light quantity of 100 mJ/cm² at a wavelength of 313 nm to obtain a horizontal orientation film. The film thickness of the obtained horizontal orientation film was measured with an ellipsometer and found to be 100 nm. In addition, a COP surface of a laminate of the obtained horizontal orientation film and the COP and a glass plate having a length of 5 cm, a width of 5 cm, and a thickness of 0.7 μm were stuck together via a pressure-sensitive sticky agent having a thickness of 15 μm, manufactured by Lintec Corporation.

Subsequently, the polymerizable liquid crystal composition for forming a horizontally oriented liquid crystal cured film was applied onto the horizontal orientation film using a spin coater. The horizontal orientation film was placed on a hot plate heated to 120° C. with the glass surface facing down, and heated for 60 seconds. At this time, a petri dish for preventing evaporation of the solvent was not installed. After that, without undergoing a particular slow cooling step, the sample was immediately placed on a metal laboratory table at room temperature (20° C.), and the sample temperature was lowered to around room temperature. Then, using a high pressure mercury lamp (Unicure VB-15201BY-A, manufactured by Ushio Inc.), the surface coated with the polymerizable liquid crystal composition for forming a horizontally oriented liquid crystal cured film was irradiated with ultraviolet rays (in a nitrogen atmosphere, the accumu-

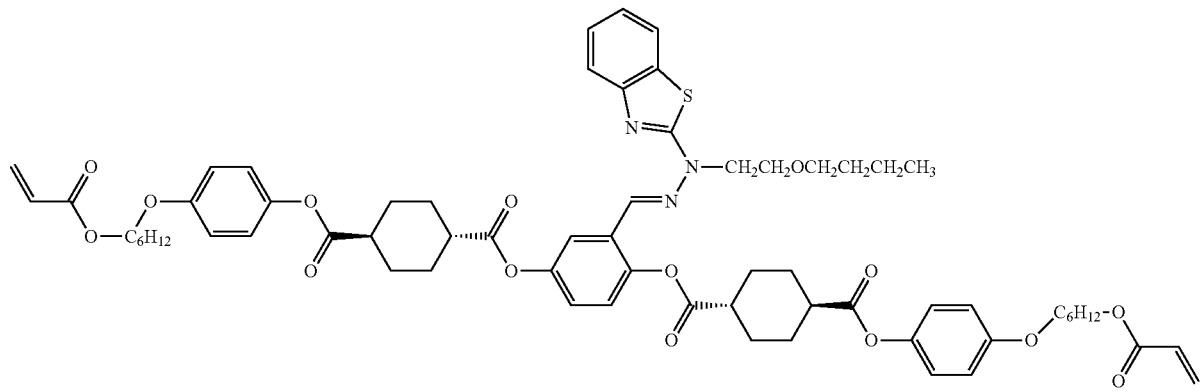

9. Comparative Example 1

A sample was prepared and evaluated in the same manner as in Example 1 except that the horizontally oriented liquid crystal cured film was prepared according to the following method. Results are shown in Table 1.

lated light quantity at a wavelength of 365 nm: 500 mJ/cm²) to form a horizontally oriented liquid crystal cured film. Then, a laminate of COP/horizontal orientation film/horizontally oriented liquid crystal cured film was peeled off from the pressure-sensitive adhesive and used for various physical property measurements and sample preparation.

TABLE 1

| | Characteristics of horizontally oriented liquid crystal cured film | | | | | | | | | | |
|---|---|---|---|---|---|---|---|---|---|---|---|
| Example | Drying step Volatile solvent concentration mg/cm³ | Slow cooling step | ReA (450) | ReA (550) | RthA (450) | RthA (550) | αA | αthA | nxA (450) | nyA (450) | nxA − nyA |
| Example 1 | 0.292 | Substantially nothing | 118 | 140 | 64 | 73 | 0.84 | 0.87 | 1.658 | 1.599 | 0.059 |

TABLE 1-continued

| | | | | | | | | | | | |
|---|---|---|---|---|---|---|---|---|---|---|---|
| Example 2 | 0.011 | Substantially nothing | 118 | 140 | 63 | 73 | 0.84 | 0.86 | 1.658 | 1.599 | 0.059 |
| Example 3 | Substantially 0 | 60° C. 30 s | 119 | 141 | 64 | 74 | 0.84 | 0.86 | 1.658 | 1.599 | 0.059 |
| Example 4 | Substantially 0 | 100° C. 30 s | 119 | 141 | 64 | 74 | 0.84 | 0.87 | 1.658 | 1.599 | 0.059 |
| Example 5 | 0.292 | Substantially nothing | 120 | 140 | 67 | 74 | 0.85 | 0.90 | 1.658 | 1.599 | 0.059 |
| Example 6 | Substantially 0 | 100° C. 30 s | 120 | 141 | 67 | 74 | 0.85 | 0.90 | 1.658 | 1.599 | 0.059 |
| Example 7 | Substantially 0 | 100° C. 30 s | 121 | 142 | 68 | 75 | 0.85 | 0.90 | 1.658 | 1.599 | 0.059 |
| Example 8 | Substantially 0 | 100° C. 30 s | 118 | 138 | 66 | 73 | 0.85 | 0.90 | 1.658 | 1.599 | 0.059 |
| Comparative Example 1 | Substantially 0 | Substantially nothing | 120 | 141 | 60 | 70 | 0.85 | 0.85 | 1.658 | 1.598 | 0.060 |

| | Characteristics of horizontally oriented liquid crystal cured film | | | | | Characteristics of vertically oriented liquid crystal cured film | | | Implementation evaluation (elliptical polarizing plate) | |
|---|---|---|---|---|---|---|---|---|---|---|
| Example | nzA (450) | nxA (550) | nyA (550) | nzA (550) | αthA − αA | RthC (550) | αthC | αthA − αthC | Front hue | Oblique hue |
| Example 1 | 1.597 | 1.633 | 1.564 | 1.562 | 0.03 | −70 | 1.12 | 0.25 | ⊙ | ○ |
| Example 2 | 1.597 | 1.633 | 1.564 | 1.562 | 0.02 | −70 | 1.12 | 0.26 | ⊙ | ○ |
| Example 3 | 1.597 | 1.633 | 1.564 | 1.562 | 0.02 | −70 | 1.12 | 0.26 | ⊙ | ○ |
| Example 4 | 1.597 | 1.633 | 1.564 | 1.562 | 0.03 | −70 | 1.12 | 0.25 | ⊙ | ○ |
| Example 5 | 1.596 | 1.633 | 1.564 | 1.562 | 0.04 | −70 | 1.12 | 0.22 | ○ | ○ |
| Example 6 | 1.596 | 1.633 | 1.564 | 1.562 | 0.05 | −70 | 1.12 | 0.22 | ○ | ○ |
| Example 7 | 1.596 | 1.633 | 1.564 | 1.562 | 0.05 | −70 | 1.12 | 0.22 | ○ | ○ |
| Example 8 | 1.596 | 1.633 | 1.564 | 1.562 | 0.04 | −70 | 1.12 | 0.22 | ○ | ○ |
| Comparative Example 1 | 1.598 | 1.634 | 1.563 | 1.563 | 0.00 | −70 | 1.12 | 0.27 | ○ | Δ |

In the horizontally oriented liquid crystal cured film described in the examples, it was confirmed that αA was small and αthA was large. It was confirmed that an oblique hue change could be suppressed in the elliptical polarizing plate including the laminate of the horizontally oriented liquid crystal cured film and the vertically oriented liquid crystal cured film.

The invention claimed is:

1. A laminate comprising:
a horizontally oriented liquid crystal cured film that is a cured material of a polymerizable liquid crystal composition containing at least one type of polymerizable liquid crystal compound; and
a vertically oriented liquid crystal cured film,
wherein the horizontally oriented liquid crystal cured film is the cured material of the polymerizable liquid crystal composition in which the polymerizable liquid crystal compound is cured in a state of being horizontally oriented with respect to a plane of the liquid crystal cured film, and satisfies a formula (1):

$$nxA(450) > nyA(450) > nzA(450) \tag{1}$$

wherein, nxA(450) represents a main refractive index at a wavelength λ of 450 nm in a film surface of the horizontally oriented liquid crystal cured film, nyA(450) represents a refractive index at a wavelength λ of 450 nm in a direction orthogonal to a direction of nxA in the same plane as nxA, and nzA(450) represents a refractive index at a wavelength λ of 450 nm in a film thickness direction of the horizontally oriented liquid crystal cured film, and satisfies a formula (2):

$$ReA(450)/ReA(550) < 1.00 \tag{2}$$

wherein ReA(λ) represents an in-plane phase difference value of the horizontally oriented liquid crystal cured film at a wavelength of λ nm, and ReA(λ)=(nxA(λ)−nyA(λ))×dA, provided that dA represents a film thickness of the horizontally oriented liquid crystal cured film, and satisfies a formula:

$$0.02 \leq \alpha thA - \alpha A \leq 0.05$$

wherein αA=ReA(450)/ReA(550), and αthA=RthA(450)/Rth(550).

2. The laminate according to claim 1, wherein the horizontally oriented liquid crystal cured film satisfies a formula (3):

$$nxA(550) > nyA(550) > nzA(550) \tag{3}$$

wherein nxA(550) represents a main refractive index at a wavelength λ of 550 nm in the film surface of the horizontally oriented liquid crystal cured film, nyA (550) represents a refractive index at a wavelength λ of 550 nm in the direction orthogonal to the direction of nxA in the same plane as nxA, and nzA(550) represents a refractive index at a wavelength λ of 550 nm in the film thickness direction of the horizontally oriented liquid crystal cured film.

3. The laminate according to claim 1, wherein the horizontally oriented liquid crystal cured film satisfies a formula (4):

$$\frac{\frac{nxA(450)+nyA(450)}{2}-nzA(450)}{\frac{nxA(550)+nyA(550)}{2}-nzA(550)} - \frac{nxA(450)-nyA(450)}{nxA(550)-nyA(550)} > 0. \tag{4}$$

4. The laminate according to claim 1, wherein the horizontally oriented liquid crystal cured film satisfies a formula (5):

$$0.02 \leq nxA(550) - nyA(550) \leq 0.10 \quad (5).$$

5. The laminate according to claim 1, wherein at least one type of polymerizable liquid crystal compound forming the horizontally oriented liquid crystal cured film is a polymerizable liquid crystal compound having a maximum absorption wavelength between wavelengths of 300 and 400 nm.

6. The laminate according to claim 1, wherein the horizontally oriented liquid crystal cured film satisfies a formula (6):

$$120 \text{ nm} \leq ReA(550) \leq 170 \text{ nm} \quad (6).$$

7. The laminate according to claim 1, satisfying a formula (7):

$$\frac{nxA(450)-nyA(450)}{nxA(550)-nyA(550)} < \frac{\frac{nxA(450)+nyA(450)}{2}-nzA(450)}{\frac{nxA(550)+nyA(550)}{2}-nzA(550)} \leq \frac{\frac{nxC(450)+nyC(450)}{2}-nzC(450)}{\frac{nxC(550)+nyC(550)}{2}-nzC(550)} \quad (7)$$

wherein $nxC(\lambda)$ represents a main refractive index at a wavelength of $\lambda$ nm in a film surface of the vertically oriented liquid crystal cured film, $nyC(\lambda)$ represents a refractive index at a wavelength of $\lambda$ nm in a direction orthogonal to a direction of nxC in the same plane as nxC, $nzC(\lambda)$ represents a refractive index at a wavelength of $\lambda$ nm in a film thickness direction of the vertically oriented liquid crystal cured film, and $nxA(\lambda)$, $nyA(\lambda)$, and $nzA(\lambda)$ are as above defined.

8. An elliptical polarizing plate comprising:
the laminate according to claim 1; and
a polarizing film.

9. The elliptical polarizing plate according to claim 8, wherein an angle between a slow axis of a horizontally oriented liquid crystal cured film in the laminate and an absorption axis of the polarizing film is 45±5°.

10. An organic EL display device comprising the elliptical polarizing plate according to claim 8.

11. A horizontally oriented liquid crystal cured film that is a cured material of a polymerizable liquid crystal composition containing at least one type of polymerizable liquid crystal compound, and the cured material of the polymerizable liquid crystal composition in which the polymerizable liquid crystal compound is cured in a state of being horizontally oriented with respect to a plane of a liquid crystal cured film, the horizontally oriented liquid crystal cured film satisfying a formula (1):

$$nxA(450) > nyA(450) > nzA(450) \quad (1)$$

wherein nxA(450) represents a main refractive index at a wavelength of 450 nm in a film surface of the horizontally oriented liquid crystal cured film, nyA(450) represents a refractive index at a wavelength $\lambda$ of 450 nm in a direction orthogonal to a direction of nxA in the same plane as nxA, and nzA(450) represents a refractive index at a wavelength of 450 nm in a film thickness direction of the horizontally oriented liquid crystal cured film, and satisfies a formula (2):

$$ReA(450)/ReA(550) < 1.00 \quad (2)$$

wherein $ReA(\lambda)$ represents an in-plane phase difference value of the horizontally oriented liquid crystal cured film at a wavelength of $\lambda$ nm, and $ReA(\lambda)=(nxA(\lambda)-nyA(\lambda))\times dA$, provided that dA represents a film thickness of the horizontally oriented liquid crystal cured film, and satisfies a formula:

$$0.02 \leq \alpha thA - \alpha A \leq 0.05$$

wherein $\alpha A = ReA(450)/ReA(550)$, and $\alpha thA = RthA(450)/Rth(550)$.

12. The horizontally oriented liquid crystal cured film according to claim 11, satisfying a formula (3):

$$nxA(550) > nyA(550) > nzA(550) \quad (3)$$

wherein nxA(550) represents a main refractive index at a wavelength $\lambda$ of 550 nm in a film surface of the horizontally oriented liquid crystal cured film, nyA(550) represents a refractive index at a wavelength $\lambda$ of 550 nm in a direction orthogonal to a direction of nxA in the same plane as nxA, and nzA(550) represents a refractive index at a wavelength $\lambda$ of 550 nm in a film thickness direction of the horizontally oriented liquid crystal cured film.

13. The horizontally oriented liquid crystal cured film according to claim 11, satisfying a formula (4):

$$\frac{\frac{nxA(450)+nyA(450)}{2}-nzA(450)}{\frac{nxA(550)+nyA(550)}{2}-nzA(550)} - \frac{nxA(450)-nyA(450)}{nxA(550)-nyA(550)} > 0 \quad (4)$$

wherein nxA(550) represents a main refractive index at a wavelength $\lambda$ of 550 nm in a film surface of the horizontally oriented liquid crystal cured film, nyA(550) represents a refractive index at a wavelength $\lambda$ of 550 nm in a direction orthogonal to a direction of nxA in the same plane as nxA, and nzA(550) represents a refractive index at a wavelength $\lambda$ of 550 nm in a film thickness direction of the horizontally oriented liquid crystal cured film.

14. The horizontally oriented liquid crystal cured film according to claim 11, satisfying a formula (5):

$$0.02 \leq nxA(550) - nyA(550) \leq 0.10 \quad (5)$$

wherein nxA(550) represents a main refractive index at a wavelength $\lambda$ of 550 nm in a film surface of the horizontally oriented liquid crystal cured film, and nyA(550) represents a refractive index at a wavelength $\lambda$ of 550 nm in a direction orthogonal to a direction of nxA in the same plane as nxA.

15. The horizontally oriented liquid crystal cured film according to claim 11, wherein at least one type of polymerizable liquid crystal compound is a polymerizable liquid crystal compound having a maximum absorption wavelength between wavelengths of 300 and 400 nm.

16. The horizontally oriented liquid crystal cured film according to claim 11, satisfying a formula (6):

$$120 \text{ nm} \leq ReA(550) \leq 170 \text{ nm} \quad (6).$$

17. A method of producing the horizontally oriented liquid crystal cured film according to claim 11, the method comprising:
forming a coating film of a polymerizable liquid crystal composition containing at least one type of polymerizable liquid crystal compound and orienting the polymerizable liquid crystal compound horizontally with respect to a plane of the coating film;

inducing orientation melting of the horizontally oriented polymerizable liquid crystal compound; and after the induction of the orientation melting, curing the polymerizable liquid crystal composition while maintaining a horizontal orientation state of the polymerizable liquid crystal compound.

18. The production method according to claim 17, wherein at least one type of polymerizable liquid crystal compound is a polymerizable liquid crystal compound having a maximum absorption wavelength between wavelengths of 300 and 400 nm.

19. The production method according to claim 17, wherein the step of inducing the orientation melting is performed by heating the polymerizable liquid crystal compound at a temperature lower than a nematic liquid crystal phase transition temperature of the polymerizable liquid crystal compound and a room temperature or higher.

20. The production method according to claim 17, wherein the step of inducing the orientation melting is performed by drying the coating film of the polymerizable liquid crystal composition in a solvent atmosphere.

\* \* \* \* \*